(12) United States Patent
Ebisuno et al.

(10) Patent No.: US 10,978,537 B2
(45) Date of Patent: Apr. 13, 2021

(54) ORGANIC LIGHT EMITTING DIODE DISPLAY

(71) Applicant: SAMSUNG DISPLAY CO., LTD., Yongin-si (KR)

(72) Inventors: Kohei Ebisuno, Asan-si (KR); Yong Ho Yang, Suwon-si (KR); Jun Hee Lee, Cheonan-si (KR); Nak Cho Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 753 days.

(21) Appl. No.: 15/582,908

(22) Filed: May 1, 2017

(65) Prior Publication Data

US 2018/0040682 A1 Feb. 8, 2018

(30) Foreign Application Priority Data

Aug. 8, 2016 (KR) .................. 10-2016-0100747

(51) Int. Cl.
*H01L 27/32* (2006.01)
*H01L 51/52* (2006.01)
*H01L 27/12* (2006.01)

(52) U.S. Cl.
CPC ........ *H01L 27/3272* (2013.01); *H01L 27/326* (2013.01); *H01L 27/3258* (2013.01); *H01L 27/3262* (2013.01); *H01L 27/3276* (2013.01); *H01L 51/5281* (2013.01); *H01L 27/1214* (2013.01); *H01L 2251/5315* (2013.01)

(58) Field of Classification Search
CPC ............. H01L 27/3272; H01L 27/3258; H01L 27/326; H01L 51/5281; H01L 27/3276; H01L 27/3262; H01L 2251/5315; H01L 27/1214

See application file for complete search history.

(56) References Cited

U.S. PATENT DOCUMENTS

| 6,734,463 | B2 * | 5/2004 | Ishikawa | ........... H01L 29/78633 257/434 |
|---|---|---|---|---|
| 2011/0234087 | A1 | 9/2011 | Takahashi et al. | |
| 2011/0297948 | A1 | 12/2011 | Jeong et al. | |
| 2013/0249878 | A1 | 9/2013 | Yamamoto et al. | |
| 2013/0270527 | A1 * | 10/2013 | Kwon | ................. H01L 33/0041 257/40 |

(Continued)

OTHER PUBLICATIONS

Extended European Search Report dated Dec. 8, 2017 for European Application No. 17185323.7.

*Primary Examiner* — Stephen W Smoot
*Assistant Examiner* — Sun Mi Kim King
(74) *Attorney, Agent, or Firm* — F. Chau & Associates, LLC

(57) ABSTRACT

An organic light emitting diode display includes a substrate, a plurality of pixels disposed on the substrate, a plurality of transmissive windows spaced apart from the pixels, and a light blocking member disposed between one of the pixels and one of the transmissive windows. The pixels display an image, and light is transmitted through the transmissive windows. Each pixel includes a transistor including a plurality of electrode members disposed in different layers on the substrate. The light blocking member includes a plurality of light blocking sub-members respectively disposed in the same layers as the plurality of electrode members.

8 Claims, 18 Drawing Sheets

(56) References Cited

U.S. PATENT DOCUMENTS

| | | |
|---|---|---|
| 2016/0172533 A1 | 6/2016 | Ahn et al. |
| 2016/0197124 A1 | 7/2016 | Kim |
| 2016/0211310 A1* | 7/2016 | Wang .................. H01L 51/5284 |
| 2016/0293687 A1 | 10/2016 | Chang et al. |

* cited by examiner

ORGANIC LIGHT EMITTING DIODE DISPLAY

CROSS-REFERENCE TO RELATED APPLICATIONS

This application claims priority under 35 U.S.C. § 119 to Korean Patent Application No. 10-2016-0100747 filed on Aug. 8, 2016, the disclosure of which is incorporated by reference herein in its entirety.

TECHNICAL FIELD

Exemplary embodiments of the present inventive concept relate to an organic light emitting diode (OLED) display.

DISCUSSION OF THE RELATED ART

An organic light emitting diode display includes two electrodes and an organic emission layer disposed therebetween. An electron injected from one electrode and a hole injected from the other electrode are coupled with each other in the organic emission layer to generate an exciton, and the exciton emits energy to emit light.

The organic light emitting diode display includes a plurality of pixels. Each pixel includes an organic light emitting diode that is formed of a cathode, an anode, and an organic emission layer. Each pixel includes a plurality of transistors and at least one capacitor. The plurality of transistors includes a switching transistor and a driving transistor. The plurality of transistors drives the organic light emitting diode. When external light is incident on a semiconductor member of a transistor, a leakage current may occur.

SUMMARY

Exemplary embodiments of the present inventive concept provide an organic light emitting diode display that reduces a leakage current.

According to an exemplary embodiment of the present inventive concept, an organic light emitting diode display includes a substrate, a plurality of pixels disposed on the substrate, a plurality of transmissive windows spaced apart from the pixels, and a light blocking member disposed between one of the pixels and one of the transmissive windows. The pixels display an image. Light is transmitted through the transmissive windows. Each pixel includes a transistor including a plurality of electrode members disposed in different layers on the substrate. The light blocking member includes a plurality of light blocking sub-members respectively disposed in the same layers as the plurality of electrode members.

In an exemplary embodiment, the plurality of electrode members includes a light blocking electrode disposed on the substrate, a semiconductor member that overlaps the light blocking electrode, a first gate electrode disposed on the semiconductor member, a second gate electrode disposed on the first gate electrode, a source electrode connected to the semiconductor member, and a drain electrode connected to the semiconductor member. The source electrode and the drain electrode are disposed on opposite sides of the first gate electrode.

In an exemplary embodiment, the plurality of light blocking sub-members includes at least two of a first light blocking sub-member disposed in the same layer as the light blocking electrode, a second light blocking sub-member disposed in the same layer as the first gate electrode, a third light blocking sub-member disposed in the same layer as the second gate electrode, and a fourth light blocking sub-member disposed in the same layer as the source electrode.

In an exemplary embodiment, each pixel includes a plurality of insulation layers respectively disposed in the different layers on the substrate. The insulation layers insulate the electrode members from one another. Each pixel further includes a first electrode connected to the transistor, a second electrode disposed on the first electrode, and an organic emission layer disposed between the first electrode and the second electrode. The transmissive window includes an opening that penetrates at least one of the plurality of insulation layers, and the transmissive window partially overlaps the second electrode.

In an exemplary embodiment, the light blocking member is electrically connected to a power line through which power is applied.

In an exemplary embodiment, the transmissive window includes a long barrier disposed adjacent to the one of the pixels and a short barrier connected to the long barrier. The light blocking member includes a long barrier light blocking member disposed adjacent to the long barrier of the transmissive window.

In an exemplary embodiment, the light blocking member further includes a short barrier light blocking member disposed adjacent to the short barrier of the transmissive window. The long barrier light blocking member and the short barrier light blocking member surround the transmissive window.

In an exemplary embodiment, the light blocking member further includes a pixel light blocking member disposed between adjacent pixels.

According to an exemplary embodiment of the present inventive concept, an organic light emitting diode display includes a substrate, a plurality of pixels disposed on the substrate, and a plurality of transmissive windows spaced apart from the pixels. The pixels display an image, and light is transmitted through the transmissive windows. Each pixel includes a transistor including a plurality of electrode members disposed in different layers on the substrate, and a transistor light blocking member disposed between the transistor and one of the transmissive windows.

In an exemplary embodiment, the organic light emitting diode display further includes a scan line disposed on the substrate, a data line disposed on the substrate, and a driving voltage line disposed on the substrate. The scan line transmits a scan signal, the data line crosses the scan line and transmits a data voltage, and the driving voltage line crosses the scan line and transmits a driving voltage. The transistor is one of a plurality of transistors. The plurality of transistors includes a switching transistor connected to the scan line and the data line, and a driving transistor connected to the switching transistor. The driving transistor includes a driving gate electrode, a driving source electrode, and a driving drain electrode. The transistor light blocking member includes a first light blocking member disposed between the driving transistor and the one of the transmissive windows.

In an exemplary embodiment, the first light blocking member is disposed between the driving transistor and a long barrier light blocking member disposed adjacent to a long barrier of the one of the transmissive windows.

In an exemplary embodiment, the plurality of transistors further includes a compensation transistor that is turned on by the scan signal and compensates a threshold voltage of the driving transistor. The compensation transistor is disposed on a current flow path between the driving drain electrode and the driving gate electrode. The transistor light blocking member further includes a second light blocking member disposed between the compensation transistor and the one of the transmissive windows.

In an exemplary embodiment, the second light blocking member is disposed between the compensation transistor and a long barrier light blocking member disposed adjacent to a long barrier of the one of the transmissive windows.

In an exemplary embodiment, the organic light emitting diode display further includes a previous scan line that extends substantially parallel with the scan line and transmits a previous scan signal, and an initialization voltage line that transmits an initialization voltage that initializes the driving transistor. The plurality of transistors further includes an initialization transistor that is turned on according to the previous scan signal and that transmits the initialization voltage to the driving gate electrode. The initialization transistor is disposed on a current flow path between the initialization voltage line and the driving gate electrode. The transistor light blocking member further includes a third light blocking member disposed between the initialization transistor and the one of the transmissive windows.

In an exemplary embodiment, the third light blocking member is disposed between the initialization transistor and a long barrier light blocking member disposed adjacent to a long barrier of the one of the transmissive windows.

In an exemplary embodiment, the organic light emitting diode display further includes a previous scan line that extends substantially parallel with the scan line and transmits a previous scan signal, and an initialization voltage line that transmits an initialization voltage that initializes the driving transistor. The plurality of transistors further includes an initialization transistor that is turned on according to the previous scan signal and that transmits the initialization voltage to the driving gate electrode. The initialization transistor is disposed on a current flow path between the initialization voltage line and the driving gate electrode. The transistor light blocking member further includes a third light blocking member disposed between the initialization transistor and the one of the transmissive windows.

In an exemplary embodiment, the organic light emitting diode display further includes a light blocking member including a long barrier light blocking member disposed adjacent to a long barrier of the one of the transmissive windows, and a short barrier light blocking member disposed adjacent to a short barrier of the one of the transmissive windows. The long barrier of the one of the transmissive windows is adjacent to one of the pixels, and the short barrier of the one of the transmissive windows is connected to the long barrier of the one of the transmissive windows. The long barrier light blocking member and the short barrier light blocking member surround the one of the transmissive windows.

In an exemplary embodiment, the organic light emitting diode display further includes a pixel light blocking member disposed between adjacent pixels.

According to an exemplary embodiment of the present inventive concept, a light blocking member includes a first light blocking sub-member, a second light blocking sub-member, a third light blocking sub-member, and a fourth light blocking sub-member. The first light blocking sub-member is disposed in a same first layer as a light blocking electrode. The light blocking electrode is included in a transistor disposed in a pixel of an organic light emitting diode display. The second light blocking sub-member is disposed in a same second layer as a first gate electrode. The first gate electrode is included in the transistor. The third light blocking sub-member is disposed in a same third layer as a second gate electrode. The second gate electrode is included in the transistor. The fourth light blocking sub-member is disposed in a same fourth layer as a source electrode. The source electrode is included in the transistor.

In an exemplary embodiment, the light blocking member is disposed between the pixel and a transmissive window of the organic light emitting diode display. Light is transmitted through the transmissive window.

According to exemplary embodiments of the present inventive concept, a leakage current of a transistor due to external light may be reduced.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
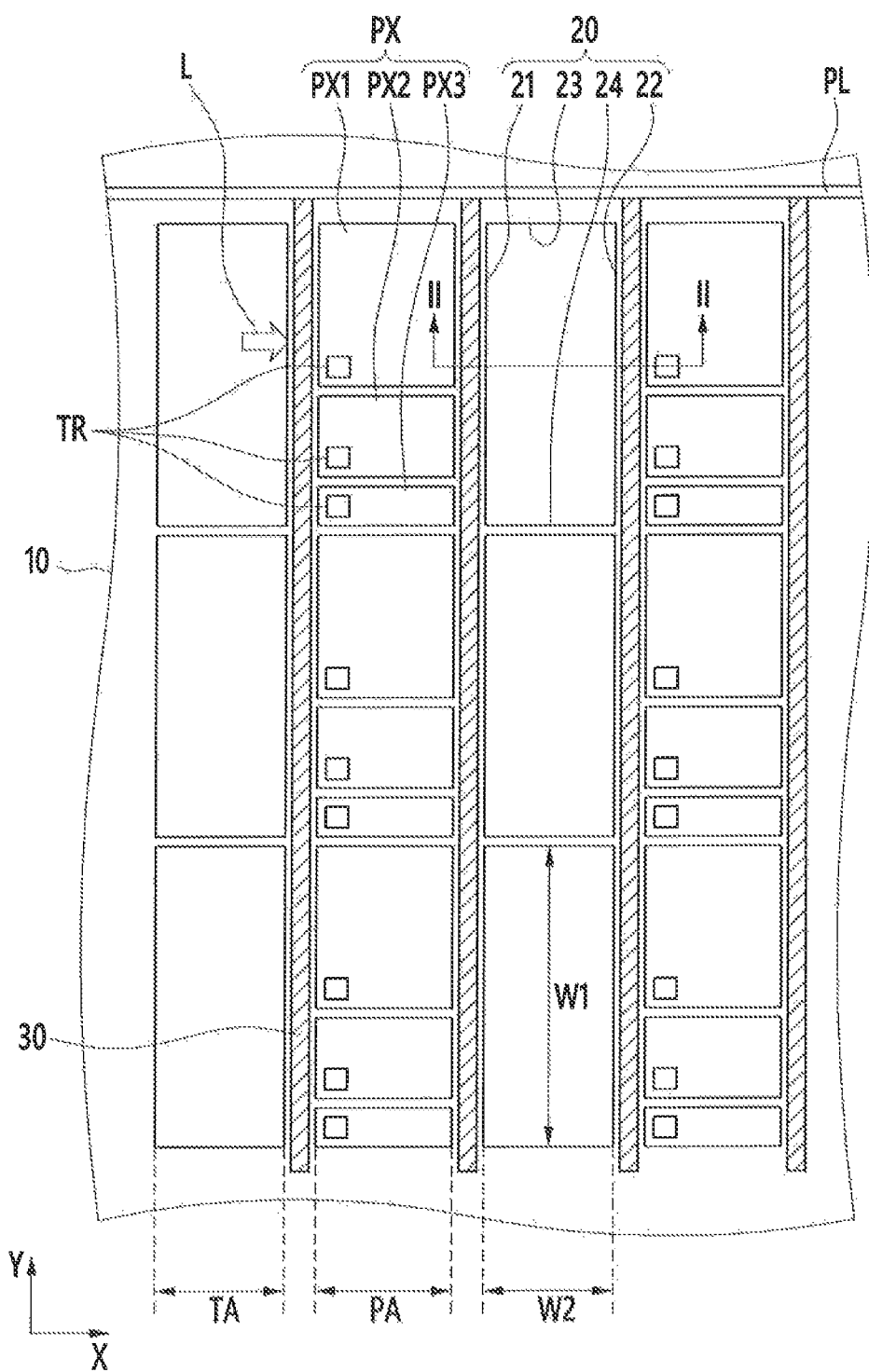
FIG. 1 is a schematic layout view of an organic light emitting diode display according to an exemplary embodiment of the present inventive concept.

Exemplary embodiments of the present inventive concept will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. It will be further understood that when two components or directions are described as extending substantially parallel or perpendicular with each other, the two components or directions extend exactly parallel or perpendicular with each other, or extend approximately parallel or perpendicular with each other as would be understood by a person having ordinary skill in the art. Further, when two processes are described as being performed substantially simultaneously or at substantially the same time as each other, it is to be understood that the processes may be performed at exactly the same time or at about the same time as would be understood by a person having ordinary skill in the art.

It will be further understood that the terms "first," "second," "third," etc, are used herein to distinguish one element from another, and the elements are not limited by these terms. Thus, a "first" element in an exemplary embodiment may be described as a "second" element in another exemplary embodiment.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

Herein, the number of transistors and the number of capacitors are not limited to the numbers shown in the accompanying drawings. According to exemplary embodiments, in a display device, each pixel may be provided with a plurality of transistors and at least one capacitor, and may be formed to have various structures by further forming additional wires or omitting existing wires. Here, a pixel refers to a minimum unit for displaying an image, and the display device displays an image using a plurality of pixels.

An organic light emitting diode display according to an exemplary embodiment of the present inventive concept will now be described with reference to the accompanying drawings.

Figure 2:
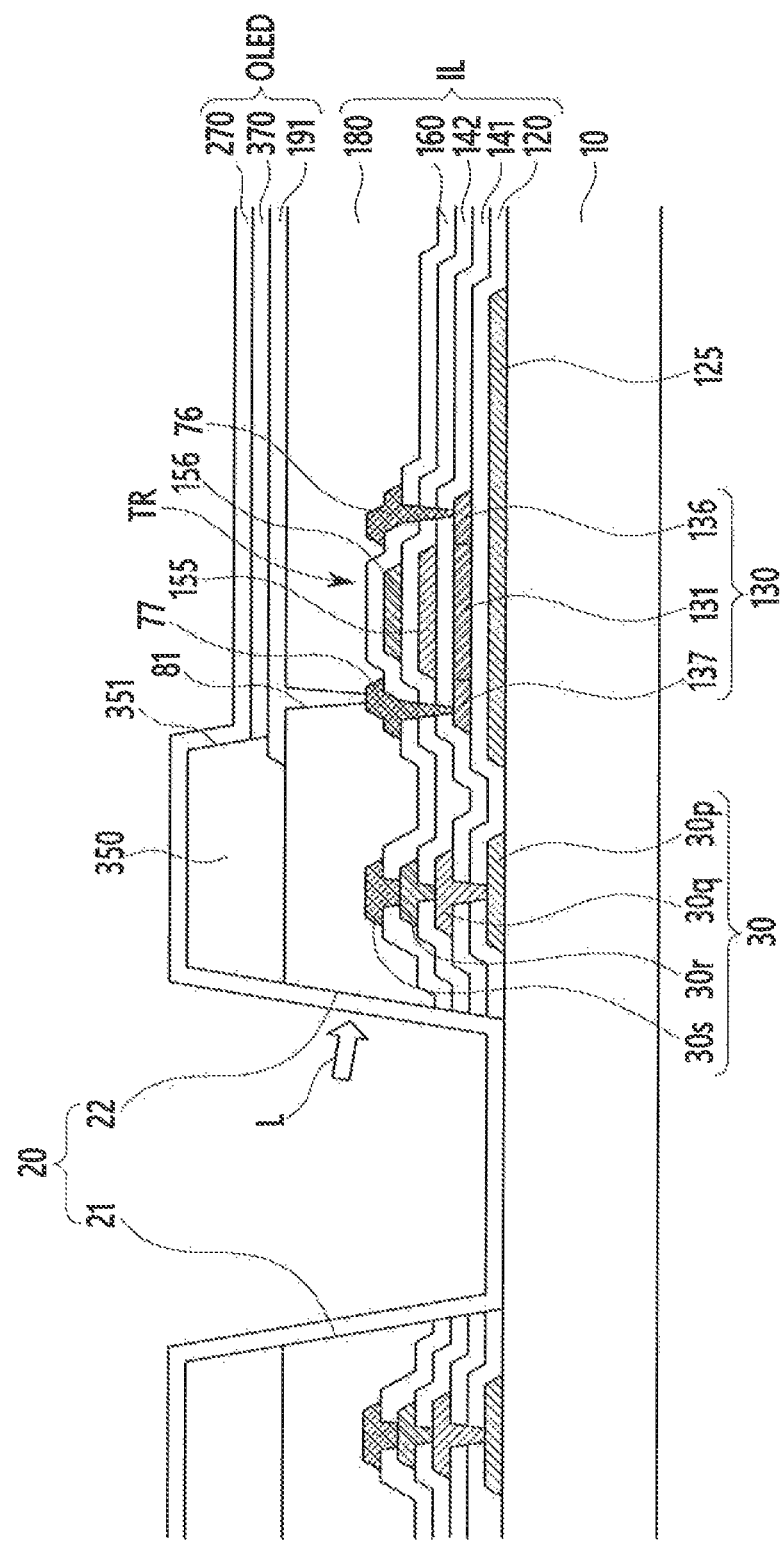
FIG. 2 is a cross-sectional view of FIG. 1 taken along line II-II according to an exemplary embodiment of the inventive concept.

FIG. 1 is a schematic layout view of an organic light emitting diode display according to an exemplary embodiment of the inventive concept. FIG. 2 is a cross-sectional view of FIG. 1 taken along line II-II according to an exemplary embodiment of the inventive concept.

As shown in FIG. 1, an organic light emitting diode display according to an exemplary embodiment includes a substrate 10. The substrate 10 includes a pixel area PA and a transmissive area TA, a plurality of pixels PX disposed on the pixel area PA that display an image, a plurality of transmissive windows 20 disposed in the transmissive area TA at a distance from the plurality of pixels PX in a first direction X and through which light is transmitted, and a light blocking member 30 disposed between the plurality of pixels PX and the transmissive windows 20. For example, the plurality of transmissive windows 20 is spaced apart from the plurality of pixels PX.

In exemplary embodiments, the substrate 10 may be an insulation substrate that is made of, for example, glass, quartz, ceramic, plastic, etc., or may be a metallic substrate that is made of, for example, stainless steel, etc.

The pixels PX may include a first pixel PX1, a second pixel PX2, and a third pixel PX3. The first pixel PX1, the second pixel PX2, and the third pixel PX3 emit light together to display various colors. To turn the respective pixels on/off, the first pixel PX1, the second pixel PX2, and the third pixel PX3 may respectively include transistors TR.

The first pixel PX1, the second pixel PX2, and the third pixel PX3 may display different colors. For example, the first pixel PX1 may display blue, the second pixel PX2 may display green, and the third pixel PX3 may display red. However, the present inventive concept is not limited thereto, and the first pixel PX1, the second pixel PX2, and the third pixel PX3 may respectively display various different colors. In addition, other pixels displaying other colors may be further included in addition to the first pixel PX1, the second pixel PX2, and the third pixel PX3.

The first pixel PX1, the second pixel PX2, and the third pixel PX3 may be different from one another in size. In FIG. 1, the first pixel PX1 is larger than the second pixel PX2, and the second pixel PX2 is larger than the third pixel PX3. However, the present inventive concept is not limited thereto. For example, in exemplary embodiments, the relative sizes of the first pixel PX1, the second pixel PX2, and the third pixel PX3 may be variously changed. In addition, in exemplary embodiments, the first pixel PX1, the second pixel PX2, and the third pixel PX3 may be substantially equal to one another in size.

The transmissive window 20 allows external light L to be transmitted while reducing a transmittance loss. The transmissive window 20 includes long barriers 21 and 22 and short barrier 23 and 24. The long barriers 21 and 22 include a first long barrier 21 and a second long barrier 22 that face each other. The first long barrier 21 and the second long barrier 21 are adjacent to the plurality of pixels PXs. The short barriers 23 and 24 include a first short barrier 23 and a second short barrier 24 that connect the first long barrier 21 and the second long barrier 22 to each other. A length W1 of the first long barrier 21 and a length W1 of the second long barrier 22 are respectively greater than a length W2 of each of the first and second short barriers 23 and 24.

The organic light emitting diode display according to an exemplary embodiment of the present inventive concept may be a transparent organic light emitting diode display including the transmissive window 20.

In FIG. 1, one transmissive window 20 is disposed adjacent to the first pixel PX1, the second pixel PX2, and the third pixel PX3. However, the present inventive concept is not limited thereto. For example, in exemplary embodiments, three separate transmissive windows 20 may be disposed respectively adjacent to the first pixel PX1, the second pixel PX2, and the third pixel PX3. Alternatively, in exemplary embodiments, a single transmissive window 20 may be disposed adjacent to three or more pixels.

The light blocking member 30 extends in a second direction Y while facing the first long barrier 21 or the second long barrier 22 of the transmissive window 20. In addition, the light blocking member 30 extends in the second direction Y while facing the plurality of pixels PXs.

The light blocking member 30 may block the external light L incident on the transistor TR of each pixel PX, Thus, a leakage current of the transistor TR due to the external light R can be reduced by blocking the external light L incident on the transistor TR in the first direction. X.

Hereinafter, a detailed structure of the pixel, the transmissive window, and the light blocking member will be described with reference to FIG. 2.

As shown in FIG. 2, each pixel PX includes a transistor TR that includes a plurality of electrode members 125, 130, 155, 156, 76, and 77 respectively disposed in different layers on the substrate 10, a plurality of insulation layers IL respectively disposed in different layers and insulating the plurality of electrode members 125, 130, 155, 156, 76, and 77 from one another, and an organic light emitting diode OLED connected to the transistor TR.

The plurality of electrode members 125, 130, 155, 156, 76, and 77 include a light blocking electrode 125 disposed on the substrate 10, a semiconductor member 130 overlapping the light blocking electrode 125, a first gate electrode 155 overlapping the semiconductor member 130, a second gate electrode 156 disposed on the first gate electrode 155, a source electrode 76, and a drain electrode 77. The source electrode 76 and the drain electrode 77 are connected to the semiconductor member 130. The source electrode 76 and the drain electrode 77 are disposed facing each other with reference to the first gate electrode 155 (e.g., the source electrode 76 and the drain electrode 77 are disposed on opposite sides of the first gate electrode 155). The light blocking electrode 125 prevents or reduces deterioration of a feature of the semiconductor member 130 by preventing or reducing the external light L from reaching the semiconductor member 130, and reduces a leakage current of the transistor TR. The semiconductor member 130 includes a channel 131 that overlaps the first gate electrode 155, a source region 136, and a drain region 137. The source region 136 and the drain region 137 are disposed at opposite sides of the channel 131.

The plurality of insulation layers (IL) includes a first insulation layer 120 that covers the light blocking electrode 125, a second insulation layer 141 that covers the semiconductor member 130, a third insulation layer 142 that covers the first gate electrode 155, a fourth insulation layer 160 that covers the second gate electrode 156, and a fifth insulation layer 180 that covers the source electrode 76 and the drain electrode 77.

The plurality of insulation layers IL includes an opening. The opening forms the transmissive window 20. For example, the transmissive window 20 includes an opening that penetrates at least one of the plurality of insulation layers (IL). The transmissive window 20 includes the first long barrier 21 and the second long barrier 22 that face each other.

The first insulation layer 120, the second insulation layer 141, the third insulation layer 142, and the fourth insulation layer 160 may include, for example, a silicon nitride (SiNx) or a silicon oxide (SiOx). The fifth insulation layer 180 may include a stacked layer of an organic material such as, for example, a polyacrylic resin, a polyimide resin, etc., or a stacked layer of an organic material and an inorganic material.

The light blocking member 30 is disposed at a distance from the plurality of electrode members 125, 130, 155, 156, 76, and 77. To reduce electrostatic discharge (ESD) during a manufacturing process, the light blocking member 30 may be electrically connected with a power line PL through which power is applied. Such a power line nay be, for example, a driving voltage line 172 (refer to FIG. 4) through which a driving voltage ELVDD is transmitted, or a common voltage line 741 (refer to FIG. 4) through which a common voltage ELVSS is transmitted.

The light blocking member 30 includes a plurality of light blocking sub-members 30p, 30q, 30r, and 30s respectively disposed in the same layers of the plurality of electrode members 125, 130, 155, 156, 76, and 77. The plurality of light blocking sub-members 30p, 30q, 30r, and 30s includes a first light blocking sub-member 30p disposed in the same layer as the light blocking electrode 125, a second light blocking sub-member 30q disposed in the same layer as the first gate electrode 155, a third light blocking sub-member 30r disposed in the same layer as the second gate electrode 156, and a fourth light blocking sub-member 30s disposed in the same layer as the source electrode 76.

In the exemplary embodiment shown in FIG. 2, the light blocking member 30 includes the first light blocking sub-member 30p, the second light blocking sub-member 30q, the third light blocking sub-member 30r, and the fourth light blocking sub-member 30s. However, the present inventive concept is not limited thereto. For example, in exemplary embodiments, the light blocking member 30 may include five or more light blocking sub-members.

The light blocking member 30 may block the external light L that is incident on the transistor TR through the transmissive window 20. Thus, a leakage current of the transistor TR due to the external light L may be reduced.

A pixel 191 (also referred to as a pixel electrode 191 or a first electrode 191) is disposed on the fifth insulation layer 180. The drain electrode 77 is connected to the pixel electrode 191 through a contact hole 81 formed in the fifth insulation layer 180. Thus, the pixel electrode 191 is connected to the transistor TR. A pixel defining layer PDL 350 is disposed on the fifth insulation layer 180 and an edge of the pixel electrode 191, and covers the fifth insulation layer 180 and the edge of the pixel electrode 191. The pixel defining layer 350 has a pixel opening 351 that overlaps the pixel electrode 191. An organic emission layer 370 is disposed on the pixel electrode 191, and a common electrode 270 (also referred to as a second electrode) is disposed on the organic emission layer 370 (and thus, is disposed on the pixel electrode 191). The pixel electrode 191, the organic emission layer 370, and the common electrode 270 form the organic light emitting diode OLED. The transmissive window 20 partially overlaps the common electrode 270.

Hereinafter, a detailed structure of the organic light emitting diode display shown in FIGS. 1 and 2 will be described with reference to FIGS. 3 and 4.

Figure 3:
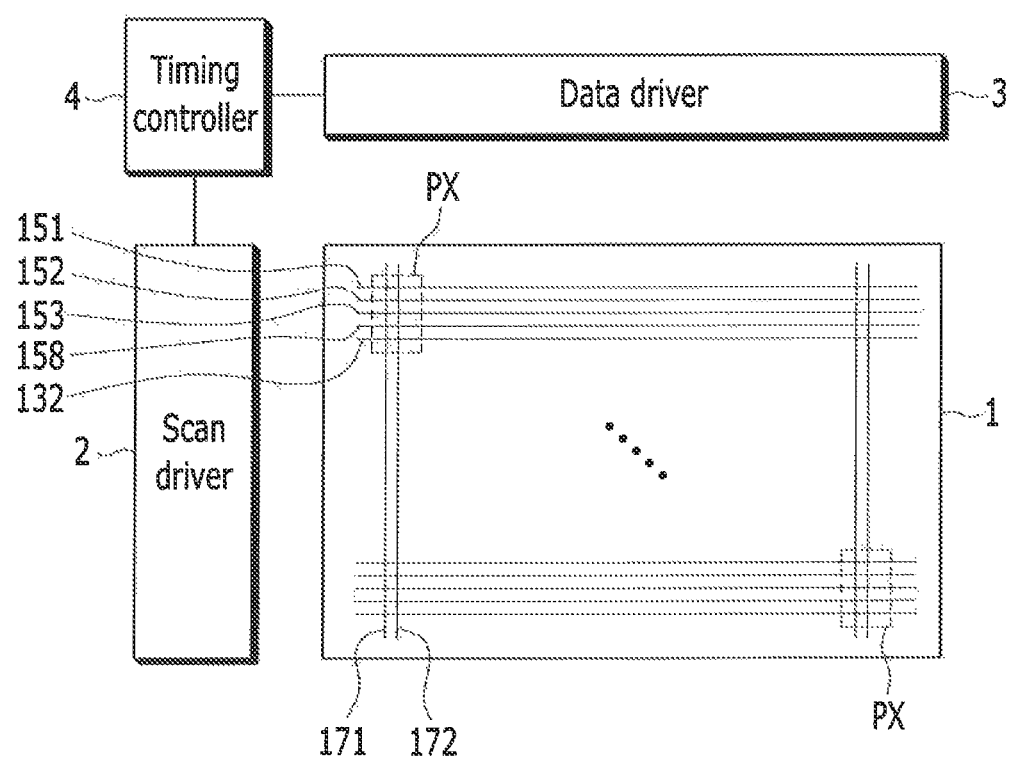
FIG. 3 is a schematic top plan view of the organic light emitting diode display of FIG. 1 according to an exemplary embodiment of the inventive concept.

FIG. 3 is a schematic top plan view of the organic light emitting diode display of FIG. 1 according to an exemplary embodiment of the inventive concept. FIG. 4 is an equivalent circuit diagram of the pixel of the organic light emitting diode display of FIG. 1 according to an exemplary embodiment of the inventive concept.

As shown in FIG. 3, the organic light emitting diode display according to an exemplary embodiment includes a display panel 1, a scan driver 2, a data driver 3, and a timing controller 4. The display panel 1 includes a plurality of signal lines 151, 152, 153, 158, 171, 172, and 132 disposed on the substrate 10, and a plurality of pixels PXs that is connected to the plurality of signal lines 151, 152, 153, 158, 171, 172, and 132. The plurality of pixels is arranged in a matrix format.

Figure 4:
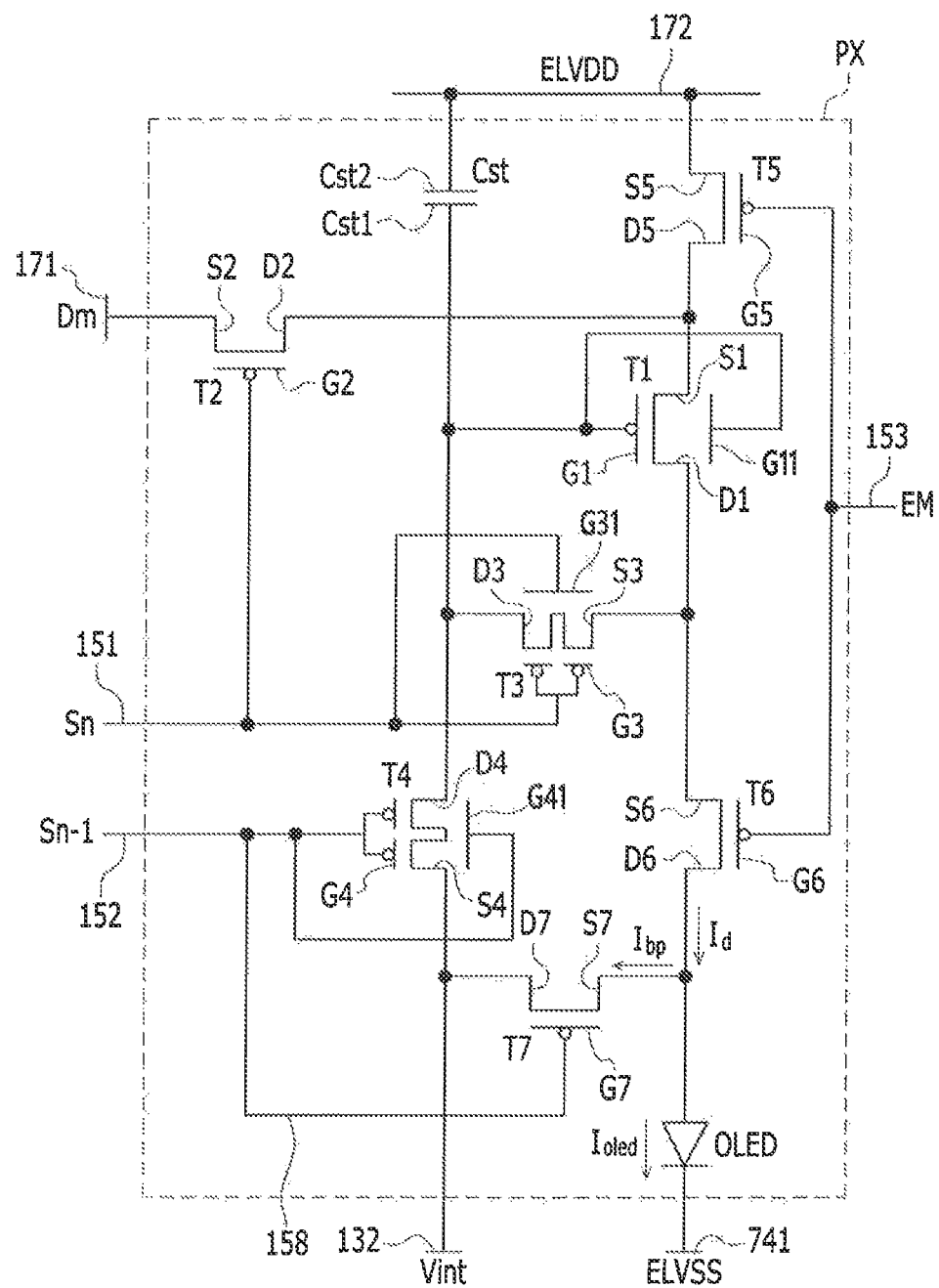
FIG. 4 is an equivalent circuit diagram of a pixel in the organic light emitting diode display of FIG. 1 according to an exemplary embodiment of the inventive concept.

As shown in FIG. 4, each pixel PX includes a plurality of transistors T1, T2, T3, T4, T5, T6, and T7 connected to the plurality of signal lines 151, 152, 153, 158, 171, 172, and 132, a storage capacitor Cst, and an organic light emitting diode OLED.

The transistors T1, T2, T3, T4, T5, T6, and T7 include a first transistor T1, a second transistor T2, a third transistor T3, a fourth transistor T4, a fifth transistor T5, a sixth transistor T6, and a seventh transistor T7 that are disposed at a distance from one another (e.g., that are spaced apart from one another). The first transistor T1 may be a driving transistor, the second transistor T2 may be a switching transistor, the third transistor T3 may be a compensation transistor, the fourth transistor T4 may be an initialization transistor, the fifth transistor T5 may be an operation control transistor, the sixth transistor T6 may be a light emission control transistor, and the seventh transistor T7 may be a bypass transistor.

The signal lines 151, 152, 153, 158, 171, 172, and 132 may include a scan line 151, a previous scan line 152, a light emission control line 153, a bypass control line 158, a data line 171, the driving voltage line 172, and an initialization voltage line 132.

The scan line 151 transmits a scan signal Sn to the switching transistor T2 and the compensation transistor T3, the previous scan line 152 transmits a previous scan signal Sn-1 to the initialization transistor T4, and the light emission control line 153 transmits a light emission control signal EM to the operation control transistor T5 and the light emission control transistor T6. The bypass control line 158 is connected to the previous scan line 152 and transmits the previous scan signal Sn-1 to the bypass transistor T7.

The data line 171 crosses the scan line 151 and transmits a data signal Dm, the driving voltage line 172 is substantially parallel with the data line 171 and transmits a driving voltage ELVDD, and the initialization voltage line 132 transmits an initialization voltage Vint that initializes the driving transistor T1.

The scan line 151, the previous scan line 152, the light emission control line 153, the bypass control line 158, the data line 171, the driving voltage line 172, and the initialization voltage line 132 are respectively connected to one pixel PX.

A gate electrode G1 of the driving transistor T1 is connected to a first end Cst1 of the storage capacitor Cst, a source electrode S1 of the driving transistor T1 is connected to the driving voltage line 172 via the operation control transistor T5, and a drain electrode D1 of the driving transistor T1 is connected to an anode of the organic light emitting diode OLED via the light emission control transistor T6. The driving transistor T1 receives the data signal Dm according to a switching operation of the switching transistor T2, and supplies a driving current Id to the organic light emitting diode OLED.

A gate electrode G2 of the switching transistor T2 is connected to the scan line 151, a source electrode S2 of the switching transistor T2 is connected to the data line 171, and a drain electrode D2 of the switching transistor T2 is connected to the source electrode S1 of the driving transistor T1 and to the driving voltage line 172 via the operation control transistor T5. The switching transistor T2 is turned on according to the scan signal Sn transmitted through the scan line 151, and performs a switching operation to transmit the data signal Dm to the source electrode S1 of the driving transistor T1.

A gate electrode G3 of the compensation transistor T3 is connected to the scan line 151, a source electrode S3 of the compensation transistor T3 is connected to the drain electrode D1 of the driving transistor T1 and to an anode of the organic light emitting diode OLED via the light emission control transistor T6, and a drain electrode D3 of the compensation transistor T3 is connected to a drain electrode D4 of the initialization transistor T4, the first end Cst C1 of the storage capacitor Cst, and the gate electrode G1 of the driving transistor T1. The compensation transistor T3 is turned on according to the scan signal Sn transmitted through the scan line 151, and diode-connects the driving transistor T1 by connecting the gate electrode G1 and the drain electrode D1 of the driving transistor T1.

A gate electrode G4 of the initialization transistor T4 is connected to the previous scan line 152, a source electrode S4 of the initialization transistor T4 is connected to the initialization voltage line 132, and the drain electrode D4 of the initialization transistor T4 is connected to the first end Cst1 of the storage capacitor Cst and the gate electrode G1 of the driving transistor T1 through the drain electrode D3 of the compensation transistor T3. The initialization transistor T4 is turned on according to the previous scan signal Sn-1 transmitted through the previous scan line 152, and performs an initialization operation to initialize a gate voltage (Vg) of the gate electrode G1 of the driving transistor T1 by transmitting the initialization voltage Vint to the gate electrode G1 of the driving transistor T1.

In an exemplary embodiment, the compensation transistor T3 and the initialization transistor T4 are provided as dual gate transistors so as to prevent or reduce a leakage current.

In this case, a light blocking electrode G11 connected to the gate electrode of the driving transistor T1 reduces a leakage current of the driving transistor T1 that may occur due to external light. Further, a light blocking electrode G31 connected to the gate electrode G3 of the compensation transistor T3 reduces a leakage current of the compensation transistor T3 that may occur due to external light, and a light blocking electrode G41 connected to the gate electrode G4 of the initialization transistor T4 reduces a leakage current of the initialization transistor T4 that may occur due to external light.

The gate electrode G5 of the operation control transistor T5 is connected to the emission control line 153, a source electrode S5 of the operation control transistor T5 is connected to the driving voltage line 172, and a drain electrode D5 of the operation control transistor T5 is connected to the source electrode S1 of the driving transistor T1 and the drain electrode D2 of the switching transistor T2.

A gate electrode G6 of the emission control transistor T6 is connected to the emission control line 153, a source electrode S6 of the emission control transistor T6 is connected to the drain electrode D1 of the driving transistor T1 and the source electrode S3 of the compensation transistor T3, and a drain electrode D6 of the emission control transistor T6 is connected to the anode of the organic light emitting diode OLED. The operation control transistor T5 and the emission control transistor T6 are substantially simultaneously turned on according to the emission control signal EM transmitted through the emission control line 153. As a result, the driving voltage ELVDD is compensated through the diode-connected driving transistor T1 and then transmitted to the organic light emitting diode OLED.

A gate electrode G7 of the bypass transistor T7 is connected to the bypass control line 158, a source electrode S7 of the bypass transistor T7 is connected to the drain electrode D6 of the emission control transistor T6 and the anode of the organic light emitting diode OLED, and a drain electrode D7 of the bypass transistor T7 is connected to the initialization voltage line 132 and the source electrode S4 of the initialization thin film transistor T4. Thus, when the driving current displaying a black image flows, a light emission current $I_{oled}$ reduced by an amount of the bypass current $I_{bp}$ leaked through the bypass transistor T7 from the driving current Id has at least an amount of current for clear representation of the black image. Therefore, according to exemplary embodiments of the inventive concept, an image having improved black luminance may be realized using the bypass transistor T7, thereby improving a contrast ratio.

A second end Cst2 of the storage capacitor Cst is connected to the driving voltage line 172, and a cathode of the organic light emitting diode OLED is connected to the common voltage line 741 that transmits the common voltage ELVSS.

The scan driver 2 transmits the scan signal Sn to the scan line 151, and the data driver 3 transmits the data signal Dm to the data line 171. The timing controller 4 generates a scan control signal, a data control signal, and an RGB signal by receiving various control signals and image signals from an external system, and transmits the generated signals to the scan driver 2 and the data driver 3.

In the exemplary embodiment shown in FIGS. 3 and 4, a pixel PX includes 7 transistors and 1 capacitor. However, the present inventive concept is not limited thereto. For example, according to exemplary embodiments, the number of transistors and the number of capacitors may be variously modified.

Hereinafter, the detailed structure of the organic light emitting diode display shown in FIGS. 1 to 4 will be described in detail with reference to FIGS. 5 to 10.

Figure 5:
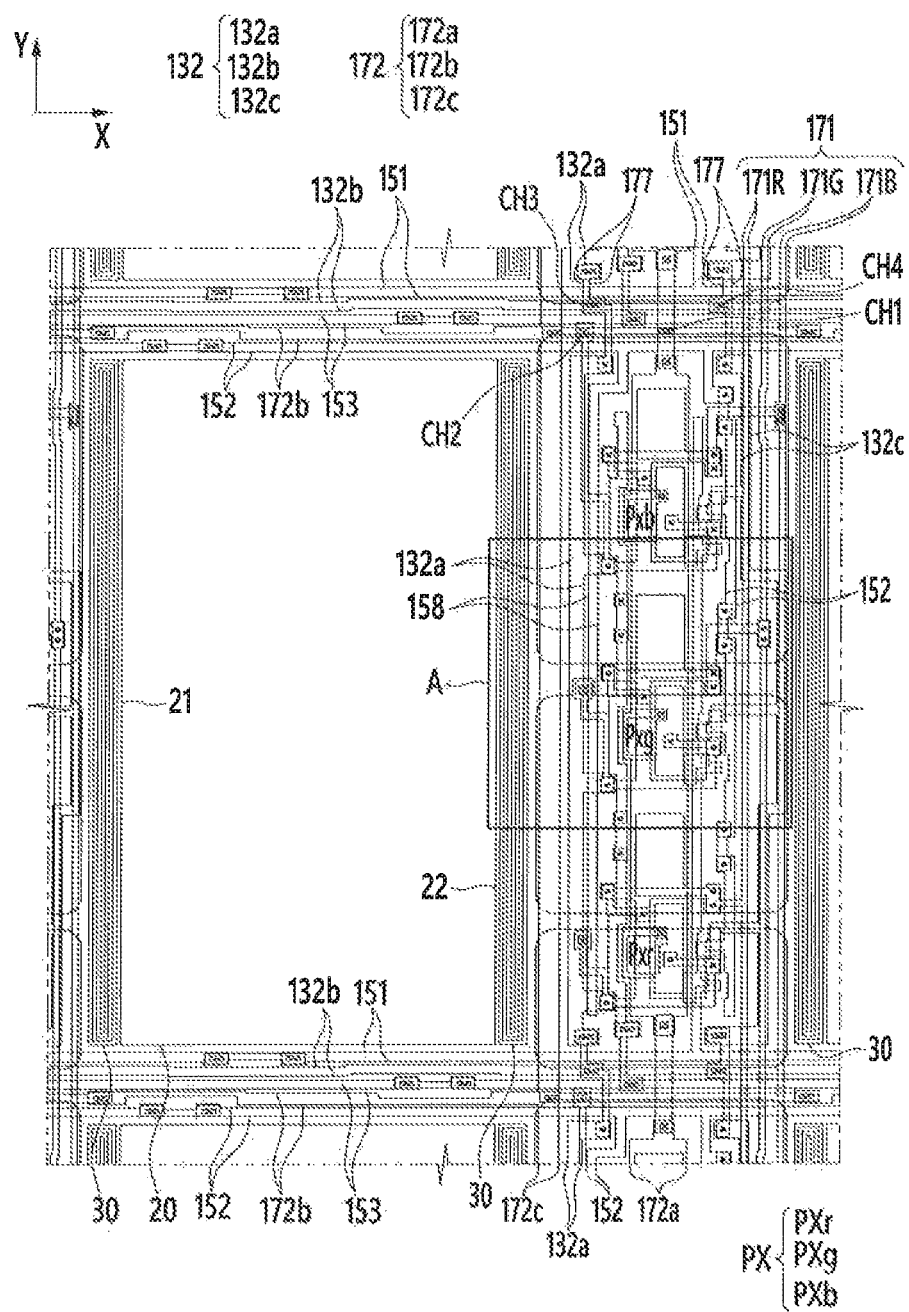
FIG. 5 is a detailed layout view of FIG. 1 according to an exemplary embodiment of the inventive concept.
Figure 6:
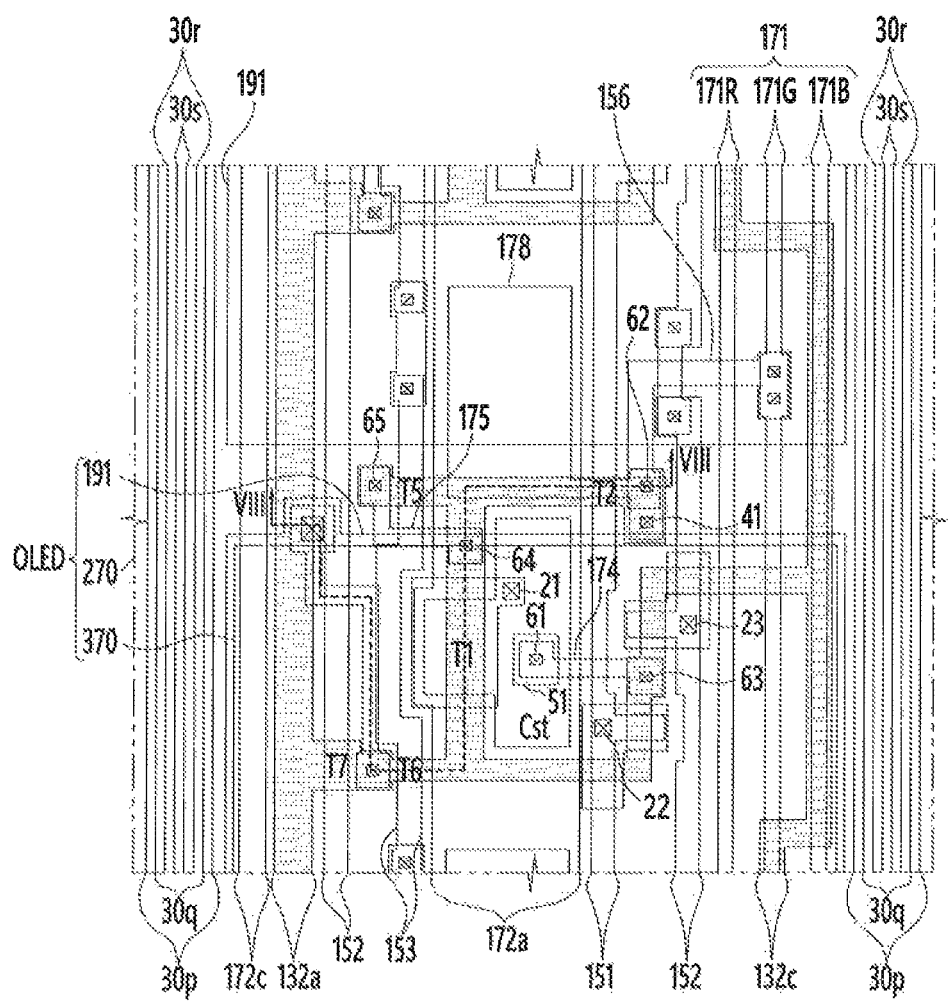
FIG. 6 shows a driving transistor and a switching transistor in an enlarged layout view of portion A of FIG. 5 according to an exemplary embodiment of the inventive concept.
Figure 7:
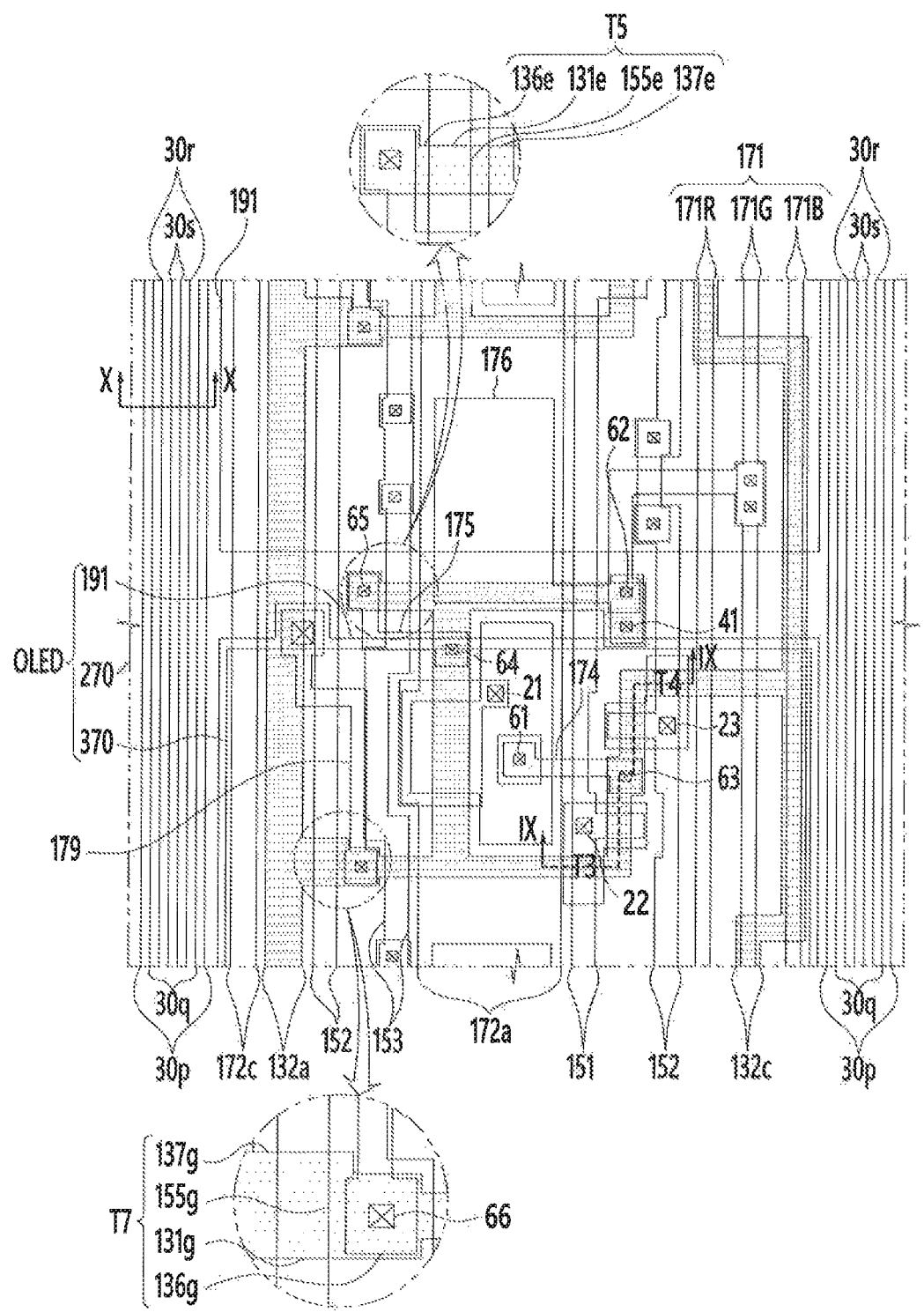
FIG. 7 is an enlarged layout view of portion A in FIG. 5, and illustrates a light blocking member, a compensation transistor, and an initialization transistor, according to an exemplary embodiment of the inventive concept.
Figure 8:
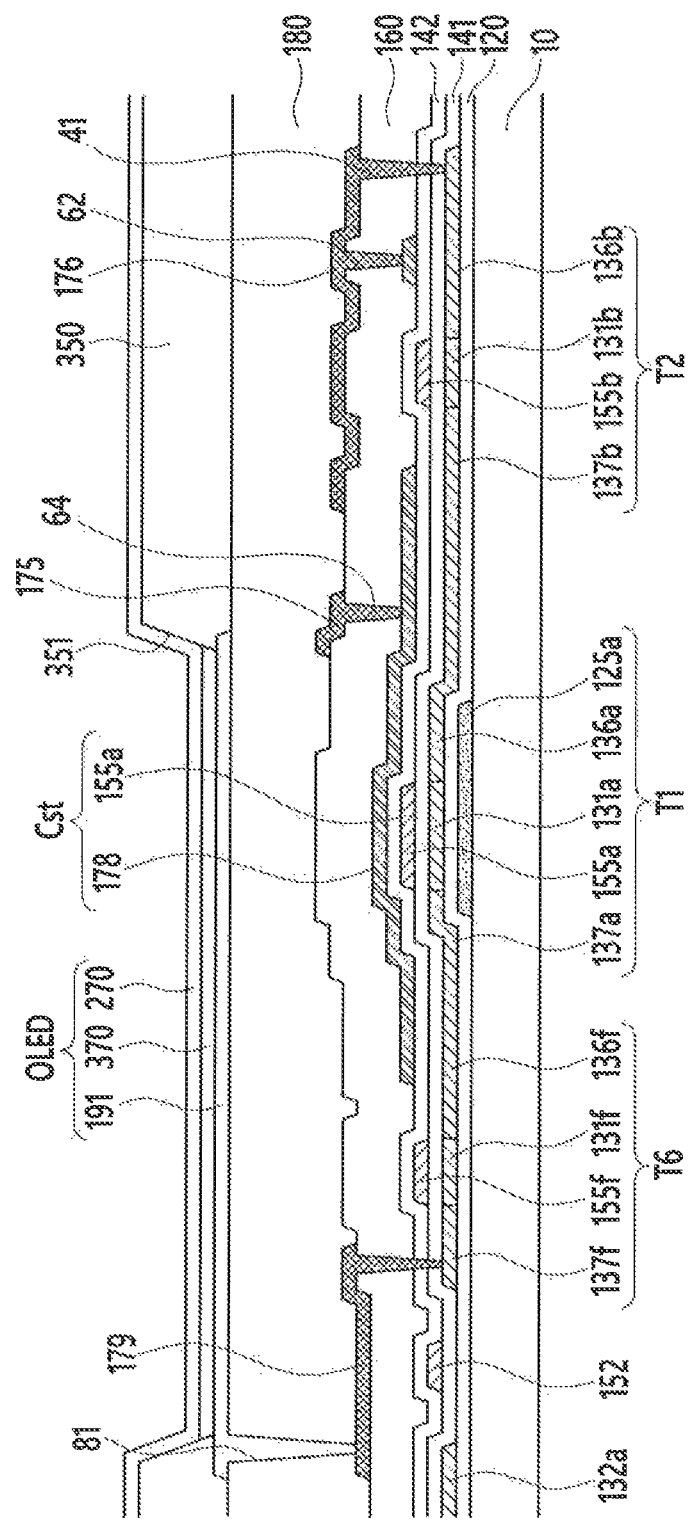
FIG. 8 is a cross-sectional view of the organic light emitting diode display of FIG. 6 taken along the line VIII-VIII, according to an exemplary embodiment of the inventive concept.
Figure 9:
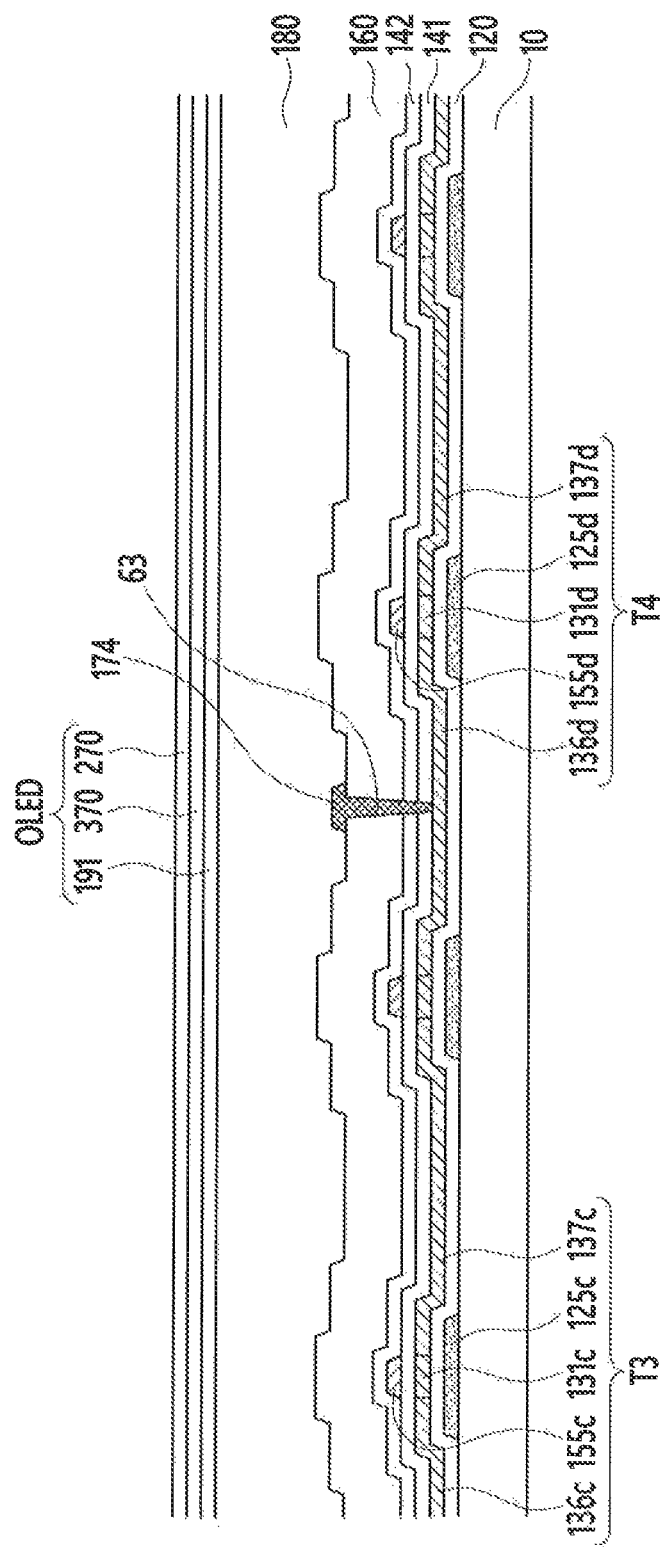
FIG. 9 is a cross-sectional view of the organic light emitting diode display of FIG. 7 taken along the line IX-IX, according to an exemplary embodiment of the inventive concept.
Figure 10:
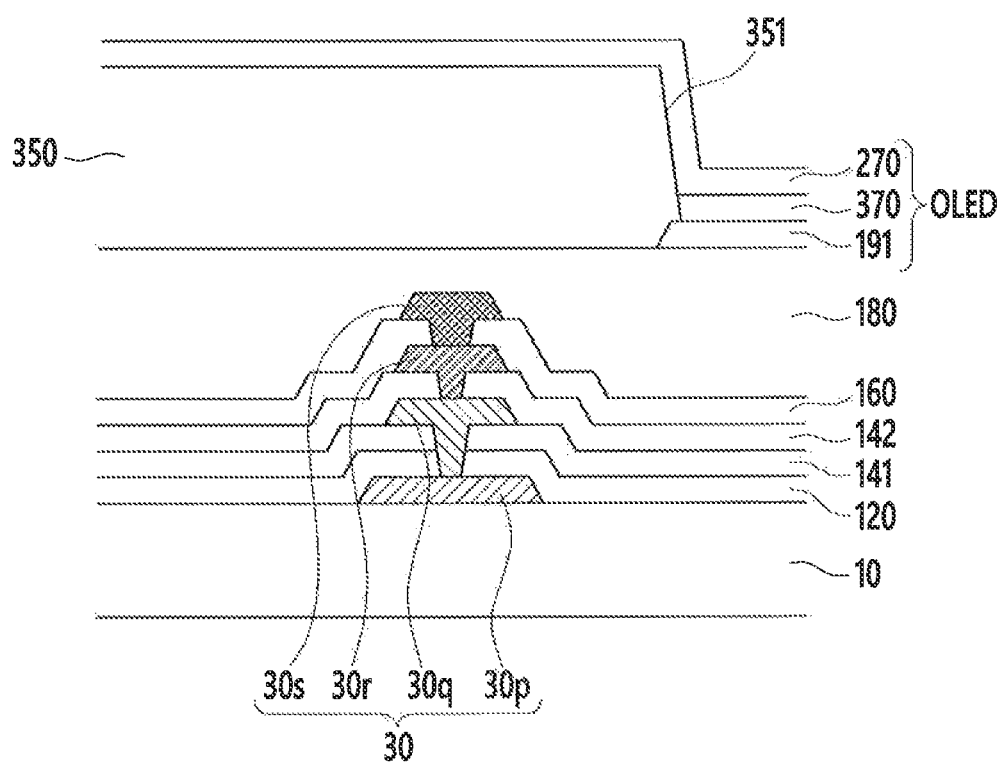
FIG. 10 is a cross-sectional view of the organic light emitting diode display of FIG. 7 taken along the line X-X, according to an exemplary embodiment of the inventive concept.

FIG. 5 is a detailed layout view of FIG. 1 according to an exemplary embodiment of the inventive concept. FIG. 6 is an enlarged layout view of the portion A in FIG. 5 illustrating the driving transistor and the switching transistor, according to an exemplary embodiment of the inventive concept. FIG. 7 is an enlarged layout view of the portion A in FIG. 5 illustrating the light blocking member, the compensation transistor, and the initialization transistor, according to an exemplary embodiment of the inventive concept. FIG. 8 is a cross-sectional view of the organic light emitting diode display of FIG. 6 taken along line VIII-VIII, according to an exemplary embodiment of the inventive concept. FIG. 9 is a cross-sectional view of the organic light emitting diode display of FIG. 7 taken along line IX-IX, according to an exemplary embodiment of the inventive concept. FIG. 10 is a cross-sectional view of the organic light emitting diode display of FIG. 7 taken along line X-X, according to an exemplary embodiment of the inventive concept.

Referring to FIG. 5, the organic light emitting diode display according to an exemplary embodiment includes the pixel PX, the transmissive window 20 disposed adjacent to the pixel PX, and the light blocking member 30 disposed between the pixel PX and the transmissive window 20.

The pixel PX includes a blue pixel PXb, a green pixel PXg, and a red pixel PXr that are sequentially arranged along a first direction X.

The scan line 151, the previous scan fine 152, and the light emission control line 153 that respective apply the scan signal Sn, the previous scan line Sn-1, and the light emission control signal EM, are respectively disposed above and below the transmissive window 20 and the pixel PX. The light emission control line 153 includes the bypass control line 158 extending into the pixel PX along a second direction Y.

The data line 171 that applies the data signal Dm to the pixel PX crosses the scan line 151, the previous scan line 152, and the light emission control line 153.

The data line 171 includes a first data line 171R that applies the data signal Dm to the red pixel PXr, a second data line 171G that applies the data signal Dm to the green pixel PXg, and a third data line 171B that applies the data signal Dm to the blue pixel PXb.

The driving voltage line 172 that applies the driving voltage ELVDD to the pixel PX includes a first driving voltage line 172a and a third driving voltage line 172c that are substantially parallel with the data line 171, and a second driving voltage line 172b that is substantially parallel with the scan line 151. The first driving voltage line 172a, the second driving voltage line 172b, and the third driving voltage line 172c are connected to one another through contact holes CH1 and CH2. Thus, compared to a comparative example in which only the first driving voltage line 172a extended in the second direction Y is provided to transmit the driving voltage ELVDD, in the exemplary embodiment of FIG. 5, the first driving voltage line 172a extended in the second direction Y and the second driving voltage line 172b extended in the first direction X are connected to each other through the contact hole CH1 such that a mesh structure may be formed, thereby reducing a voltage drop of the driving voltage line 172. In addition, since the additional third driving voltage line 172c is connected to the first driving voltage line 172a, the voltage drop of the driving voltage line 172 may be additionally reduced.

The initialization voltage line 132 that applies the initialization voltage Vint to the pixel PX includes a first initialization voltage line 132a and a third initialization voltage line 132c that are substantially parallel with the data line 171, and a second initialization voltage line 132b that is substantially parallel with the scan line 151. The first initialization voltage line 132a and the second initialization voltage line 132b are connected to each other through a contact hole CH3. The third initialization voltage line 132c and the second initialization voltage line 132b are connected to each other through a contact hole CH4. For example, the second initialization voltage line 132b is connected to an initialization connection member 177 through the contact hole CH3, and the initialization connection member 177 is connected to the first initialization voltage line 132a. Similarly, the second initialization voltage line 132b is connected to the initialization connection member 177 through the contact hole CH4, and the initialization connection member 177 is connected to the third initialization voltage line 132c through a contact hole.

The light blocking member 30 is disposed between the first long barrier 21 of the transmissive window 20 and the data line 171. In addition, the light blocking member 30 is disposed between the second long barrier 22 of the transmissive window 20 and the third driving voltage line 172c.

As shown in FIGS. 5 to 8, the driving transistor T1, the switching transistor T2, the compensation transistor T3, the initialization transistor T4, the operation control transistor T5, the light emission control transistor T6, the bypass transistor T7, the storage capacitor Cst, and the organic light emitting diode (OLED) are disposed in each of the blue pixel PXb, the green pixel PXg, and the red pixel PXr that together form the pixel PX.

As shown in FIG. 8, the driving transistor T1 includes a driving light blocking electrode 125a, a driving channel 131a, a driving gate electrode 155a, a driving source electrode 136a, and a driving drain electrode 137a.

As shown in FIGS. 6 to 8, the driving light blocking electrode 125a and the driving gate electrode 155a overlap the driving channel 131a, and the driving source electrode 136a and the driving drain electrode 137a are disposed at opposite sides of the driving channel 131a. The driving light blocking electrode 125a and the driving gate electrode 155a are connected to each other through a contact hole 21. The driving gate electrode 155a is connected to a driving connection member 174 through a contact hole 61.

The driving light blocking electrode 125a is disposed below the driving channel 131a and blocks external light from being incident on the driving channel 131a. Thus, a leakage current due to external light may be reduced.

The switching transistor T2 includes a switching channel 131b, a switching gate electrode 155b, a switching source electrode 136b, and a switching drain electrode 137b. The switching gate electrode 155b, which is a part of the scan line 151, overlaps the switching channel 131b, and the switching source electrode 136b and the switching drain electrode 137b are disposed adjacent to opposite sides of the switching channel 131b. The switching source electrode 136b is connected to the data line 171 through a contact hole 41.

As shown in FIGS. 6, 7, and 9, the compensation transistor T3 includes a compensation light blocking electrode 125c, a compensation channel 131c, a compensation gate electrode 155c, a compensation source electrode 136c, and a compensation drain electrode 137c. The compensation gate electrode 155c, which is a part of the scan line 151, includes two compensation gate electrodes 155c that prevent or reduce leakage current, and overlaps the compensation channel 131c. The compensation source electrode 136c and the compensation drain electrode 137c are disposed adjacent to opposite sides of the compensation channel 131c. The compensation light blocking electrode 125c and the compensation gate electrode 155c are connected to each other through a contact hole 22. The compensation drain electrode 137c is connected to the driving connection member 174 through a contact hole 63. The compensation light blocking electrode 125c is disposed below the compensation channel 131c and blocks external light from being incident on the compensation channel 131c. Accordingly, a leakage current due to external light may be reduced.

The initialization transistor T4 includes an initialization light blocking electrode 125d, an initialization channel 131d, an initialization gate electrode 155d, an initialization source electrode 136d, and an initialization drain electrode 137d. The initialization gate electrode 155d, which is a part of the previous scan line 152, includes two initialization gate electrodes 155d that prevent or reduce leakage current, and overlaps the initialization channel 131d. The initialization source electrode 136d and the initialization drain electrode 137d are respectively disposed adjacent to opposite sides of the initialization channel 131d. The initialization light blocking electrode 125d and the initialization gate electrode 155d are connected to each other through a contact hole 23. The initialization light Hocking electrode 125d is disposed below the initialization channel 131d, and prevents or reduces external light from being incident on the initialization channel 131d. Thus, a leakage current due to external light may be reduced.

The operation control transistor T5 includes an operation control channel 131e, an operation control gate electrode 155e, an operation control source electrode 136e, and an operation control drain electrode 137e. The operation control gate electrode 155e, which is a part of the light emission control line 153, overlaps the operation control channel 131e. The operation control source electrode 136e and the operation control drain electrode 137e are respectively disposed adjacent to opposite sides of the operation control channel 131e. The operation control source electrode 136e is connected to an operation control connection member 175 through a contact hole 65. The operation control connecting member 175 is connected to the first driving voltage line 172a through a contact hole 64.

As shown in FIGS. 6 to 8, the light emission control transistor T6 includes a light emission control channel 131f, a light emission control gate electrode 155f, a light emission control source electrode 136f, and a light emission control drain electrode 137f. The light emission control gate electrode 155f, which is a part of the light emission control line 153, overlaps the light emission control channel 131f. The light emission control source electrode 136f and the light emission control drain electrode 137f are respectively disposed adjacent to opposite sides of the light emission control channel 131f. The light emission control drain electrode 137f is connected with a pixel connection member 179 through a contact hole 66.

The bypass transistor T7 includes a bypass channel 131g, a bypass gate electrode 155g, a bypass source electrode 136g, and a bypass drain electrode 137g. The bypass gate electrode 155g, which is a part of the previous scan line 152, overlaps the bypass channel 131g. The bypass source electrode 136g and the bypass drain electrode 137g are respectively disposed adjacent to opposite sides of the bypass channel 131g. The bypass source electrode 136g is directly connected to the light emission control drain electrode 137f.

A first end of the driving channel 131a of the driving transistor T1 is connected to the switching drain electrode 137b and the operation control drain electrode 137e, and a second end of the driving channel 131a is connected to the compensation source electrode 136c and the light emission control source electrode 136f.

The driving channel 131a, the switching channel 131b, the compensation channel 131c, the initialization channel 131d, the operation control channel 131e, the light emission control channel 131f, and the bypass channel 131g may include, for example, a polysilicon or oxide semiconductor material. The oxide semiconductor material may include, for example, a metal oxide such as zinc (Zn), indium (In), gallium (Ga), tin (Sn), titanium (Ti), etc., or a combination of a metal such as zinc (Zn), indium (In), gallium (Ga), tin (Sn), and titanium (Ti) and an oxide thereof. The oxide may include, for example, at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

The organic light emitting diode OLED includes the pixel electrode 191, the organic emission layer 370, and the common electrode 270.

The storage capacitor Cst includes a first storage electrode 155a and a second storage electrode 178. The third insulation layer 142 is disposed between the first storage electrode 155a and the second storage electrode 178. The first storage electrode 155a corresponds to the driving gate electrode 155a, and the second storage electrode 178 is a partial area of the first driving voltage line 172a. The third insulation layer 142 may be a dielectric, and charges charged in the storage capacitor Cst and a voltage between the first storage electrode 155a and the second storage electrode 178 determine a storage capacitance.

The first storage electrode 155a, which is the driving gate electrode 155a, is connected to a first end of the driving connection member 174 through the contact hole 61 and a storage groove 51. The storage groove 51 is formed in the second storage electrode 178. Thus, the contact hole 61 through which the first end of the driving connection member 174 and the driving gate electrode 155a are connected is disposed in the storage groove 51. The driving connection member 174 is disposed in the same layer as the data line 171, and a second end of the driving connection member 174 is connected to the compensation drain electrode 137c of the compensation transistor T3 and the initialization drain electrode 137d of the initialization transistor T4. Thus, the driving connection member 174 connects the driving gate electrode 155a, the compensation drain electrode 137c of the compensation transistor T3, and the initialization drain electrode 137d of the initialization transistor T4.

Therefore, the storage capacitor Cst has a storage capacitance that corresponds to a difference between the driving voltage ELVDD transmitted to the second storage electrode 178 through the first driving voltage line 172a and the driving gate voltage Vg of the driving gate electrode 155a.

The light blocking member 30 includes a plurality of light blocking sub-members 30p, 30q, 30r, and 30s. The plurality of light blocking sub-members 30p, 30q, 30r, and 30s includes a first light blocking sub-member 30p, a second light blocking sub-member 30q, a third light blocking sub-member 30r, and a fourth light blocking sub-member 30s. The first light blocking sub-member 30p is disposed in the same layer as the driving light blocking electrode 125a. The second light blocking sub-member 30q is disposed in the same layer as the driving gate electrode 155a. The third light blocking sub-member 30r is disposed in the same layer as the first driving voltage line 172a. The fourth light blocking sub-member 30s is disposed in the same layer as the driving connection member 174.

The light blocking sub-members 30p, 30q, 30r, and 30s are connected to one another such that external light L that is incident on the pixel PX from the first long barrier 21 of the transmissive window 20 may be more effectively blocked.

Hereinafter, a cross-sectional structure of the organic light emitting diode display of an exemplary embodiment will be described in detail according to a stacking sequence with reference to FIGS. 8 to 10.

A stacking structure of the operation control transistor T5 and the bypass transistor T7 is substantially the same as the stacking structure of the light emission control transistor T6, Therefore, a further detailed description thereof may be omitted herein.

The driving light blocking electrode 125a, the compensation light blocking electrode 125c, and the initialization light blocking electrode 125d are disposed on the substrate 10. The first insulation layer 120 is disposed on and covers the driving light blocking electrode 125a, the compensation light blocking electrode 125c, and the initialization light blocking electrode 125d.

The driving channel 131a, the switching channel 131b, the compensation channel 131c, the initialization channel 131d, and the light emission control channel 131f are disposed on the first insulation layer 120. The driving source electrode 136 and the driving drain electrode 137a are respectively disposed at opposite sides of the driving channel 131a, and the switching source electrode 136b and the switching drain electrode 137b are disposed at opposite sides of the switching channel 131b. In addition, the compensation source electrode 136c and the compensation drain electrode 137c are disposed at opposite sides of the compensation channel 131c, and the initialization source electrode 136d and the initialization drain electrode 137d are disposed at opposite sides of the initialization channel 131d. The light emission control source electrode 136f and the light emission control drain electrode 137f are disposed at opposite sides of the light emission control channel 131f.

The second insulation layer 141 is disposed on and covers the driving channel 131a, the switching channel 131b, the compensation channel 131c, the initialization channel 131d, and the light emission control channel 131f. First gate metal lines 151, 152, 153, and 155a that include the scan line 151 that includes the switching gate electrode 155b and the compensation gate electrode 155c, the previous scan line 152 that includes the initialization gate electrode 155d and the bypass gate electrode 155g, the light emission control line 153 that includes the light emission control gate electrode 155f, and the driving gate electrode (e.g., the first storage electrode) 155a are disposed on the second insulation layer 141.

The third insulation layer 142 is disposed on and covers the first gate metal lines 151, 152, 153, and 155a and the second insulation layer 141. Second gate metal lines 172a and 132b that include the first driving voltage line 172a and the second initialization voltage line 132b are disposed on the third insulation layer 142.

The first gate metal lines 151, 152, 153, and 155a and the second gate metal lines 172a and 132b may include, for example, a single layer that includes one of copper (Cu), a copper alloy, aluminum (Al), an aluminum alloy, molybdenum (Mo), and a molybdenum alloy, or a multi layer in which a metal that includes one of, for example, copper (Cu), a copper alloy, aluminum (Al), an aluminum alloy, molybdenum (Mo), and a molybdenum alloy is stacked.

The fourth insulation layer 160 is disposed on and covers the third insulation layer 142 and the second gate metal lines 172a and 132b. The fourth insulation layer 160 may be made of, for example, a silicon nitride (SiNx) or a silicon oxide (SiOx).

The fourth insulation layer 160 includes the contact holes 61, 62, 63, 64, 65, and 66. Data metal lines 171, 174, 175, and 179 that include the data line 171, the driving connection member 174, the operation control connection member 175, and the pixel connection member 179 are disposed on the fourth insulation layer 160. The data metal layer may be formed of a multi-layer of a metal layer including at least one of, for example, copper, a copper alloy, aluminum, and an aluminum alloy and a metal layer including at least one of molybdenum and a molybdenum alloy. The data metal layer may be formed of, for example, a triple layer of titanium/aluminum/titanium (Ti/Al/Ti) or a triple layer of molybdenum/copper/molybdenum (Mo/Cu/Mo).

The data line 171 is connected to the switching source electrode 136b through the connection member 156, and a part of the first driving voltage line 172a becomes the second storage electrode 178.

The fifth insulation layer 180 is disposed on and covers the data metal lines 171, 174, 175, and 179 and the fourth insulation layer 160. Since the fifth insulation layer 180 planarizes the data metal lines 171, 174, 175, and 179 by covering the same, the pixel electrode 191 (e.g., the first electrode) may be disposed on a passivation layer (e.g., the fifth insulation layer 180) without a step difference. The fifth insulation layer 180 may be made of an organic material such as, for example, a polyacrylate resin and a polyimide resin, or a stacked layer of the organic material and an inorganic material.

The pixel electrode 191 is disposed on the fifth insulation layer 180. The pixel connecting member 179 is connected to the pixel electrode 191 through a contact hole 81 included in the fifth insulation layer 180.

The pixel defining layer 350 is disposed on and covers the fifth insulation layer 180 and an edge of the pixel electrode 191. The pixel defining layer 350 includes the pixel opening 351 that overlaps the pixel electrode 191. The pixel defining layer 350 may be made of, for example, a polyacrylate resin, a polyimide resin, etc., or a silica-based inorganic material.

The organic emission layer 370 is disposed on the pixel electrode 191, and the common electrode 270 (e.g., the second electrode), is disposed on the organic emission layer 370. The common electrode 270 is also disposed on the pixel defining layer 350 such that the common electrode 270 may be formed through the plurality of pixels PXs. The pixel electrode 191, the organic emission layer 370, and the common electrode 270 form the organic light emitting diode OLED.

The pixel electrode 191 becomes an anode, which is a hole injection electrode, and the common electrode 270 becomes a cathode, which is an electron injection electrode. However, the present inventive concept is not limited thereto. For example, in exemplary embodiments, the pixel electrode 191 may become a cathode and the common electrode 270 may become an anode. The holes and electrodes are injected into the organic emission layer 370 from the pixel electrode 191 and the common electrode 270, respectively, and an excitor generated by coupling an injected hole and electron falls from an excited state to a ground state to emit light.

Although the light blocking member 30 is disposed only between the long barriers 21 and 22 of the transmissive window 20 and the pixel PX in the exemplary embodiment shown in FIGS. 1 and 2, the present inventive concept is not limited thereto. For example, in exemplary embodiments, the light blocking member 30 may be disposed between the short harriers 23 and 24 of the transmissive window 20 and the pixel PX.

Hereinafter, an organic light emitting diode display according to an exemplary embodiment of the present inventive concept will be described with reference to FIG. 11.

Figure 11:
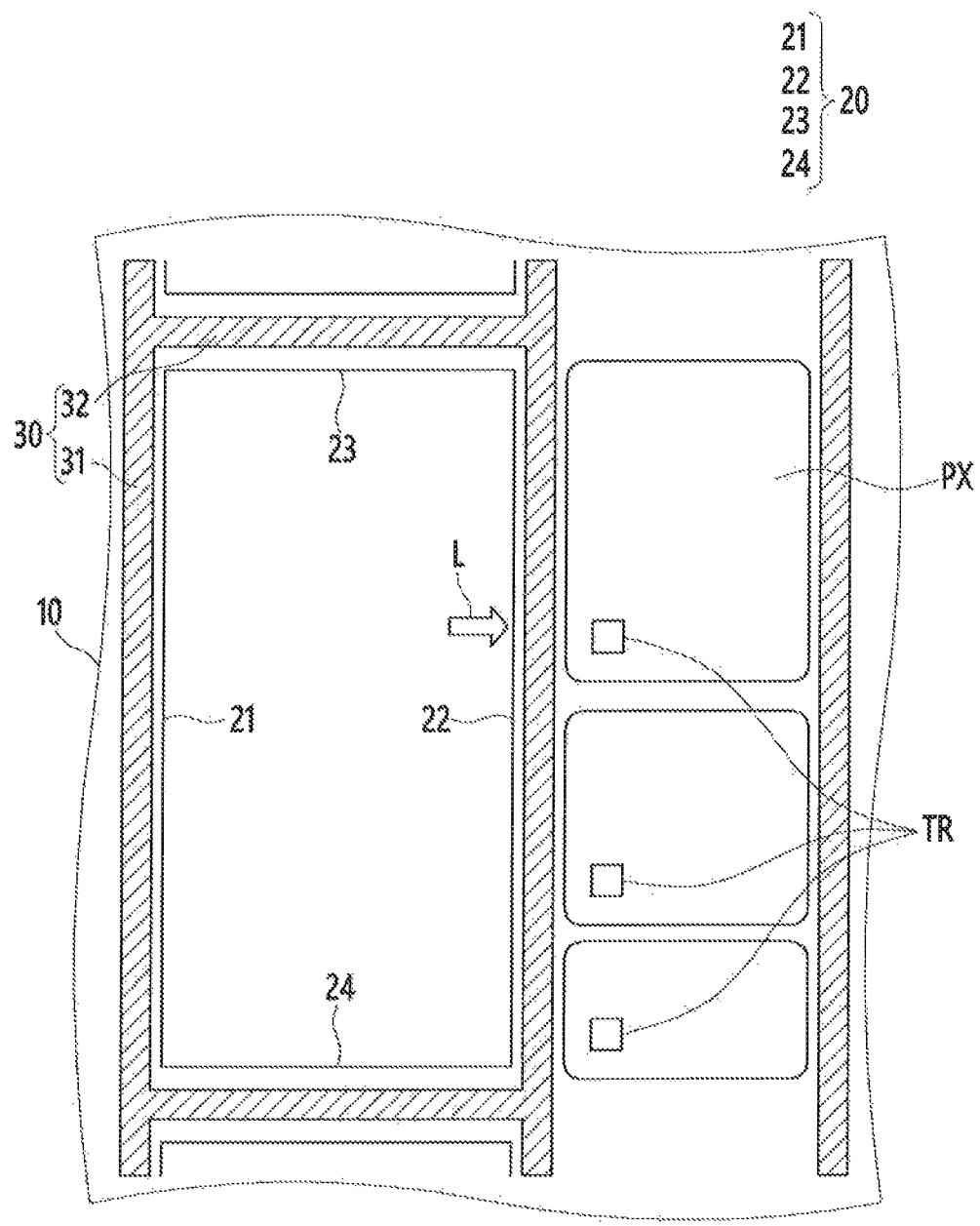
FIG. 11 is a schematic layout view of an organic light emitting diode display according to an exemplary embodiment of the inventive concept.

FIG. 11 is a schematic layout view of an organic light emitting diode display according to an exemplary embodiment of the inventive concept.

The exemplary embodiment shown in FIG. 11 is substantially the same as the exemplary embodiment shown in FIGS. 1 and 2, except for a structure of a light blocking member. For convenience of explanation, a further description of elements previously described may be omitted herein.

As shown in FIG. 11, a light blocking member 30 of the organic light emitting diode display according to an exemplary embodiment includes a long barrier light blocking member 31 and a short barrier light blocking member 32. The long barrier light blocking member 31 is disposed in areas corresponding to long barriers 21 and 22 of a transmissive window 20, and the short barrier light blocking member 32 is disposed in areas corresponding to short barriers 23 and 24 of the transmissive window 20. For example, in an exemplary embodiment, the long barrier light blocking member 31 includes portions respectively disposed adjacent to the long barriers 21 and 22 of the transmissive window 20, and the short barrier light blocking member 32 includes portions respectively disposed adjacent to the short barriers 23 and 24 of the transmissive window 20.

The long barrier light blocking member 31 and the short barrier light blocking member 32 surround (e.g., entirely surround) the transmissive window 20. Thus, the light blocking member 30 may block (e.g., entirely block) external light L incident on transistors TR of a pixel PX by way of both the long barriers 21 and 22, and the short barriers 23 and 24 of the transmissive window 20. Accordingly, a leakage current of the transistors TR due to the external light L may be further reduced.

In the exemplary embodiment shown in FIG. 11, the light blocking member 30 is disposed adjacent to the long barriers 21 and 22 and the short barriers 23 and 25 of the transmissive window 20. In exemplary embodiments, the light blocking member 30 may further be disposed between neighboring pixels PX.

Hereinafter, an organic light emitting diode display according to an exemplary embodiment of the present inventive concept will be described with reference to FIG. 12.

Figure 12:
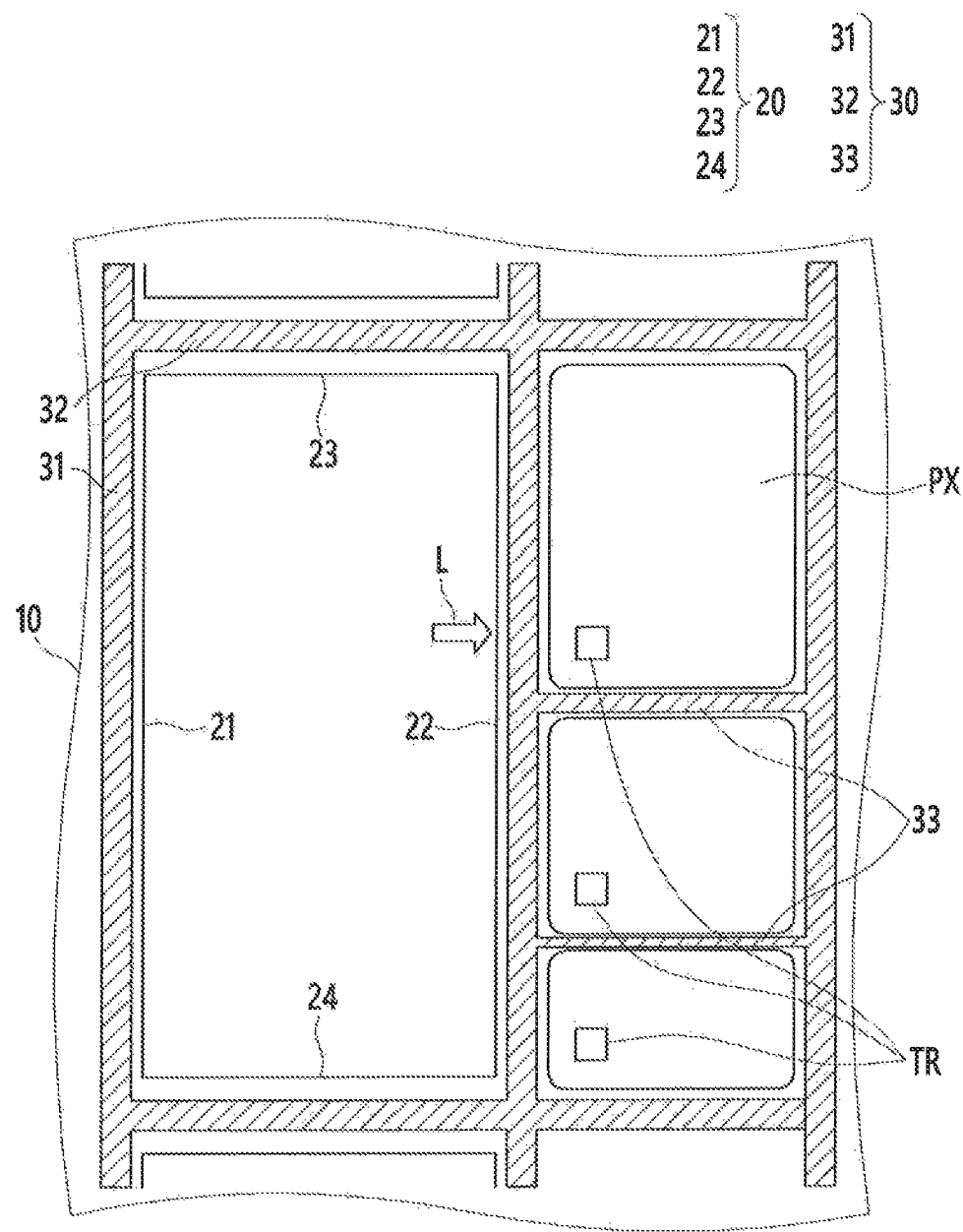
FIG. 12 is a schematic layout view of an organic light emitting diode display according to an exemplary embodiment of the inventive concept.

FIG. 12 is a schematic layout view of an organic light emitting diode display according to an exemplary embodiment of the inventive concept.

The exemplary embodiment shown in FIG. 12 is substantially the same as the exemplary embodiment shown in FIG. 11, except for a structure of a light blocking member. For convenience of explanation, a further description of elements previously described may be omitted herein.

As shown in FIG. 12, the organic light emitting diode display according to an exemplary embodiment includes a light blocking member 30 including a long barrier light blocking member 31, a short barrier light blocking member 32, and a pixel light blocking member 33. The long barrier light blocking member 31 is disposed in areas corresponding to long barriers 21 and 22 of a transmissive window 20, and the short barrier light blocking member 32 is disposed in areas corresponding to short barriers 23 and 24 of the transmissive window 20. For example, in an exemplary embodiment, the long barrier light blocking member 31 includes portions respectively disposed adjacent to the long barriers 21 and 22 of the transmissive window 20, and the short barrier light blocking member 32 includes portions respectively disposed adjacent to the short barriers 23 and 24 of the transmissive window 20. In addition, the pixel light blocking member 33 is disposed between neighboring pixels PXs (e.g., between adjacent pixels PX).

Since the pixel light blocking member 33 is disposed between neighboring pixels PXs, external light L incident on transistors of the pixel PX may be directly blocked. The light blocking member 30 may block (e.g., entirely block) external light L incident on transistors TR of pixels PX by way of both the long barrier light blocking member 31 and the short barrier light blocking member 32, as well as by way of the pixel light blocking member 33. Thus, a leakage current of the transistors TR due to the external light L may be further reduced.

Thus, according to exemplary embodiments of the inventive concept, the light blocking member 30 may be disposed between a transmissive window 20 and a pixel PX, and the light blocking member 30 may also be disposed between a transmissive window 20 and a transistor TR.

Hereinafter, an organic light emitting diode display according to an exemplary embodiment of the present inventive concept will be described with reference to FIG. 13.

Figure 13:
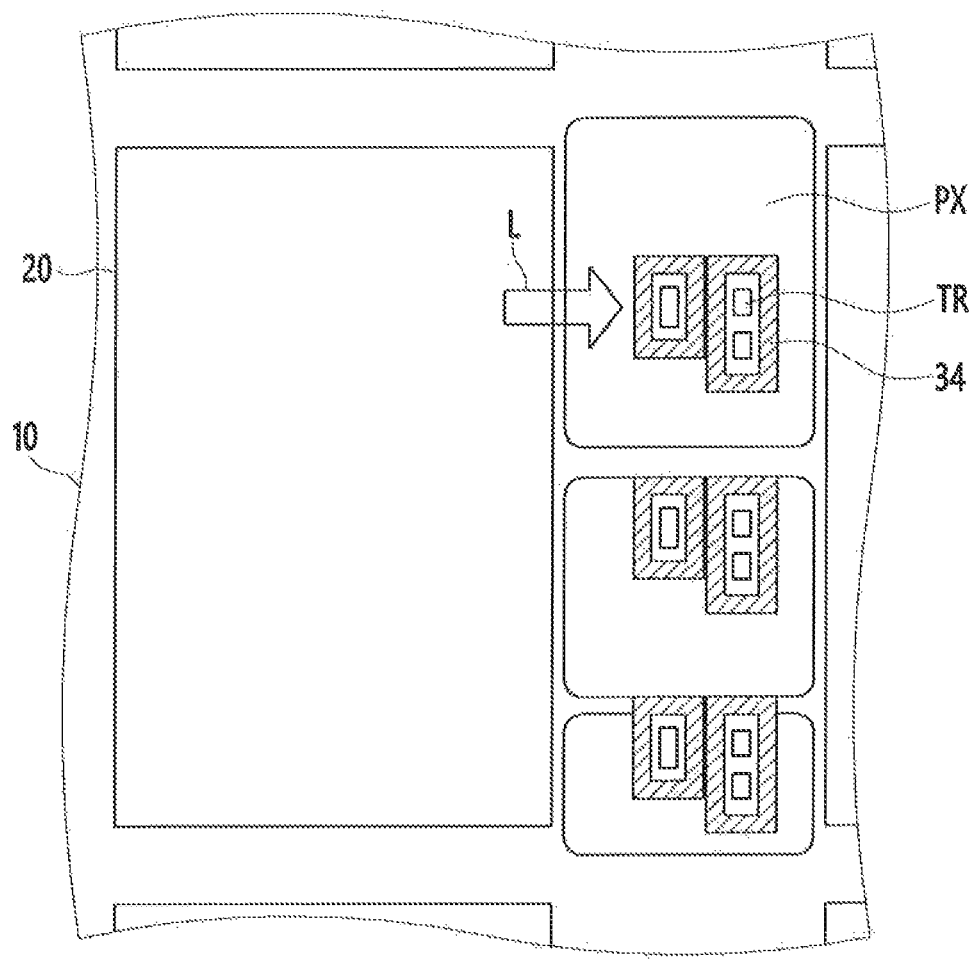
FIG. 13 is a schematic layout view of an organic light emitting diode display according to an exemplary embodiment of the inventive concept.

FIG. 13 is a schematic layout view of an organic light emitting diode display according to an exemplary embodiment of the inventive concept.

The exemplary embodiment shown in FIG. 13 is substantially the same as the exemplary embodiment shown in FIGS. 1 and 2, except for a structure of a light blocking member. For convenience of explanation, a further description of elements previously described may be omitted herein.

As shown in FIG. 13, an organic light emitting diode display according to an exemplary embodiment includes a substrate 10, a plurality of pixels PX disposed on the substrate 10 and including transistors TR, a plurality of transmissive windows 20 disposed at a distance from (e.g. spaced apart from) the pixels PX and through which light is transmitted, and a transistor light blocking member 34 disposed between the transistor TR and the transmissive window 20. The transistor light blocking member 34 may surround (e.g., entirely surround) the transistor TR.

Since the transistor light blocking member 34 surrounds the transistor TR, external light R incident on the transistor TR of the pixel PX from the transmissive window 20 may be further blocked (e.g. completely blocked). Thus, a leakage current of the transistors TR due to the external light L may be further reduced.

A detailed exemplary embodiment with respect to the transistor light blocking member 34 that is disposed between the transistor TR and the transmissive window 20 will now be described with reference to FIGS. 14 and 15.

Figure 14:
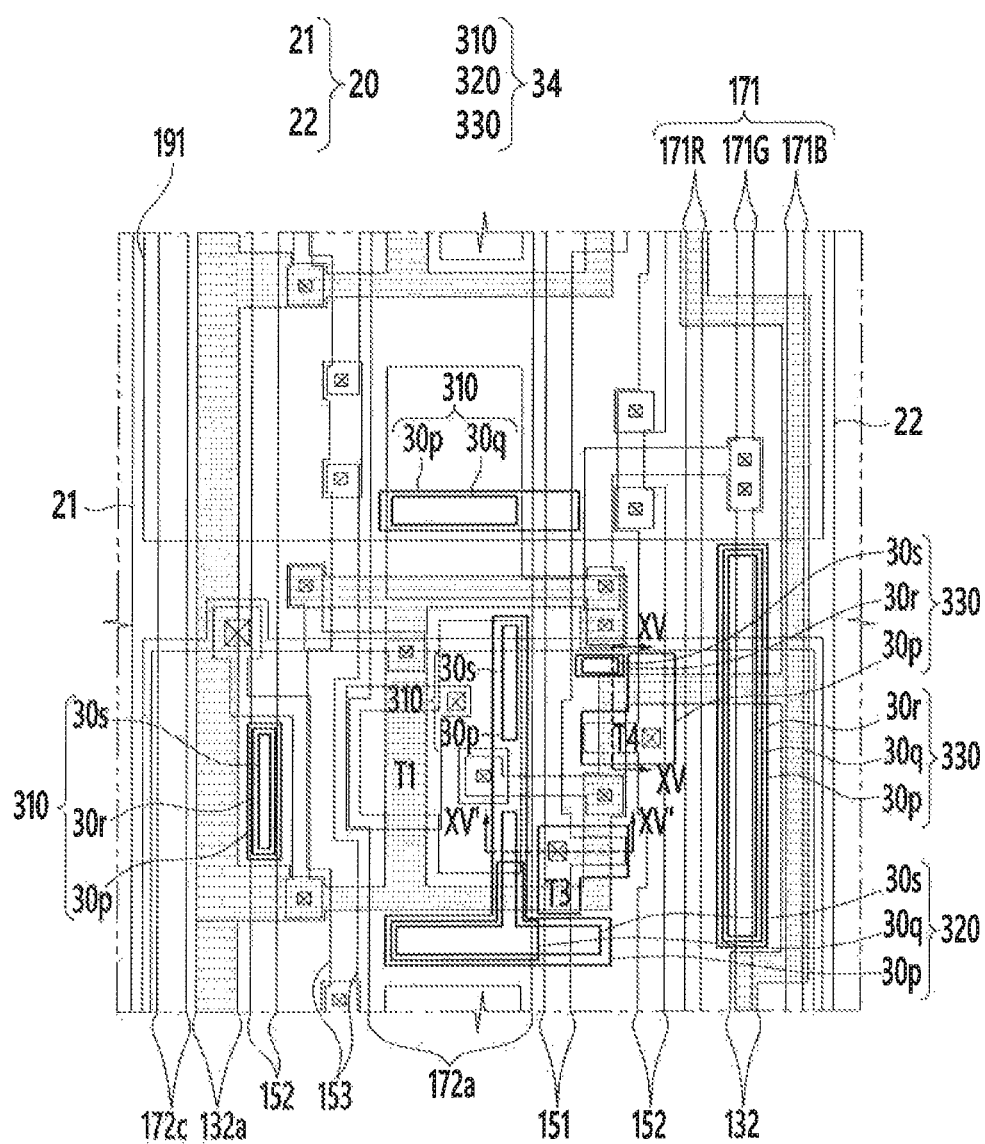
FIG. 14 is a detailed layout view of the organic light emitting diode display of FIG. 13 according to an exemplary embodiment of the inventive concept.

FIG. 14 is a detailed layout view of the organic light emitting diode display of FIG. 13 according to an exemplary embodiment of the inventive concept. FIG. 15 is a cross-sectional view of the organic light emitting diode display of FIG. 14 taken along lines XV-XV and XV'-XV' according to an exemplary embodiment of the inventive concept.

Figure 15:
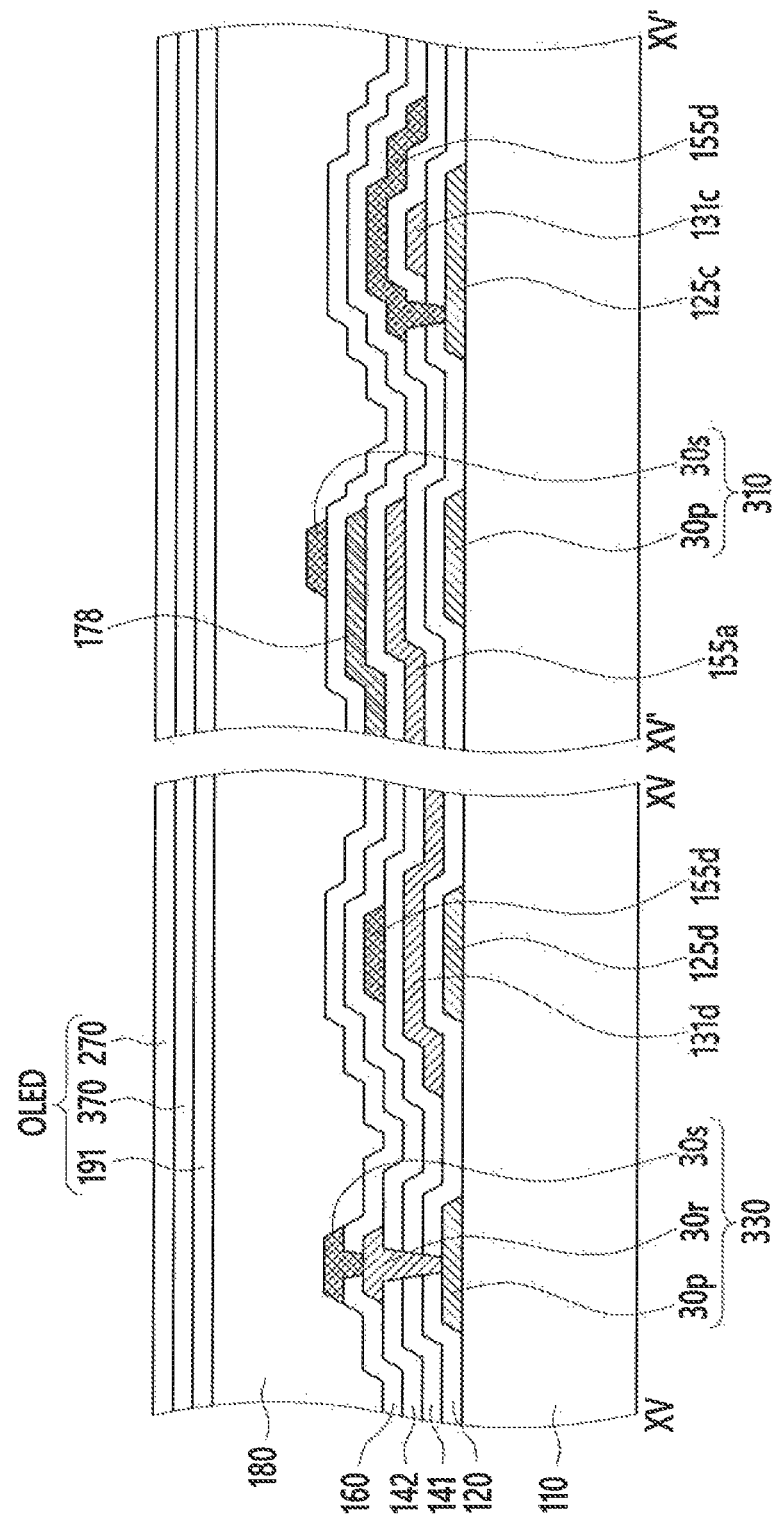
FIG. 15 is a cross-sectional view of the organic light emitting diode display of FIG. 14 taken along lines XV-XV and XV'-XV', according to an exemplary embodiment of the inventive concept.

The exemplary embodiment shown in FIGS. 14 and 15 is substantially the same as the exemplary embodiment shown in FIGS. 5 to 10, except for a structure of a light blocking member. For convenience of explanation, a further description of elements previously described may be omitted herein.

As shown in FIGS. 14 and 15, the transistor light blocking member 34 includes a first light blocking member 310 disposed between a driving transistor T1 of a transistor light blocking member 34 and long barriers 21 and 22 of a transmissive window 20, a second light blocking member 320 disposed between a compensation transistor T3 and long barriers 21 and 22 of the transmissive window 20, and a third light blocking member 330 disposed between an initialization transistor T4 and the long barriers 21 and 22 of the transmissive window 20.

The first light blocking member 310 is disposed adjacent to a driving transistor T1. The first light blocking member 310 may be disposed at a left side and an upper side of the driving transistor T1. However, the location of the first light blocking member 310 is not limited thereto. For example, in exemplary embodiments, the first light blocking member 310 may be disposed at a right side and a lower side of the driving transistor T1, and the location may be variously further modified.

The first light blocking member 310 disposed at the left side of the driving transistor T1 may include a first sub-member 30$p$, a third sub-member 30$r$, and a fourth sub-member 30$s$. The first light blocking member 310 disposed at the upper side of the driving transistor T1 may include the first sub-member 30$p$ and a second sub-member 30$q$. The first light blocking member 310 is electrically separated from a driving light blocking electrode 125$a$, a driving channel 131$a$, a driving gate electrode 155, a driving source electrode 136$a$, and a driving drain electrode 137$a$ that form the driving transistor T1. Since the first light blocking member 310 is disposed adjacent to the driving transistor T1, external light L incident on the driving transistor T1 from the transmissive window 20 may be blocked (e.g., completely blocked). The first light blocking member 310 may be disposed between the driving transistor T1 and the long barrier light blocking member 31 of the light blocking member 30.

The second light blocking member 320 is disposed adjacent to the compensation transistor T3. The second light blocking member 320 may be disposed at a lower side and a left side of the compensation transistor T3. However, the locations of the second light blocking members 320 are not limited thereto. For example, in exemplary embodiments, the second light blocking members 320 may be disposed at a right side and an upper side of the compensation transistor T3, and the locations of the second light blocking members 320 may be further variously modified.

The second light blocking member 320 disposed at a lower side of the compensation transistor T3 may include a first sub-member 30$p$, a second sub-member 30$q$, and a fourth sub-member 30$s$. The second light blocking member 320 disposed at the left side of the compensation transistor T3 may include a first sub-member 30$p$ and a fourth sub-member 30$s$. The second light blocking member 320 is electrically separated from a compensation light blocking electrode 125$c$, a compensation channel 131$c$, a compensation gate electrode 155$c$, a compensation source electrode 136$c$, and a compensation drain electrode 137$c$. Since the second light blocking member 320 is disposed adjacent to the compensation transistor T3, external light L incident on the compensation transistor T3 from the transmissive window 20 may be blocked (e.g., completely blocked), Thus, in exemplary embodiments, the second light blocking member 320 is disposed between the compensation transistor T3 and the transmissive window 20, The second light blocking member 320 may be disposed between the compensation transistor T3 and the long barrier light blocking member 31 of the light blocking member 30.

The third light blocking member 330 is disposed adjacent to the initialization transistor T3. The third light blocking member 330 may be disposed at an upper side and a right side of the initialization transistor T4, However, the locations of the third light blocking member 330 are not limited thereto. For example, in exemplary embodiments, the third light blocking member 330 may be disposed at a left side and a lower side of the initialization transistor T4, and locations of the third light blocking member 330 may be further variously modified.

The third light blocking member 330 disposed at the upper side of the initialization transistor T4 may include a first sub-member 30p, a third sub-member 30r, and a fourth sub-member 30s. The third light blocking member 330 disposed at the right side of the initialization transistor T4 may include a first sub-member 30p, a second sub-member 30q, and a third sub-member 30r. The third light blocking member 330 is electrically separated from an initialization light blocking electrode 125d, an initialization channel 131d, an initialization gate electrode 155d, an initialization source electrode 136, and an initialization drain electrode 137d. Since the third light blocking member 330 is disposed adjacent to the initialization transistor T4, external light L incident on the initialization transistor T4 from the transmissive window 20 may be blocked (e.g., completely blocked). The third light blocking member 330 may be disposed between the initialization transistor T4 and the long barrier light bloc ting member 31 of the light blocking member 30.

In the exemplary embodiment shown in FIGS. 14 and 15, the transistor light blocking members 310, 320, and 330 that are adjacent to the driving transistor T1, the compensation transistor T3, and the initialization transistor T4 are illustrated. However, the inventive concept is not limited thereto. For example, in exemplary embodiments, the transistor light blocking members 310, 320, and 330 may be disposed adjacent to other transistors.

In the exemplary embodiments of FIGS. 13 to 15, the transistor light blocking members that surround the transistors are illustrated. However, the inventive concept is not limited thereto. For example, the light blocking member may be disposed between the transmissive window and the pixel together with the transistor light blocking member according to exemplary embodiments.

Hereinafter, an organic light emitting diode display according to an exemplary embodiment of the present inventive concept will be described with reference to FIG. 16.

Figure 16:
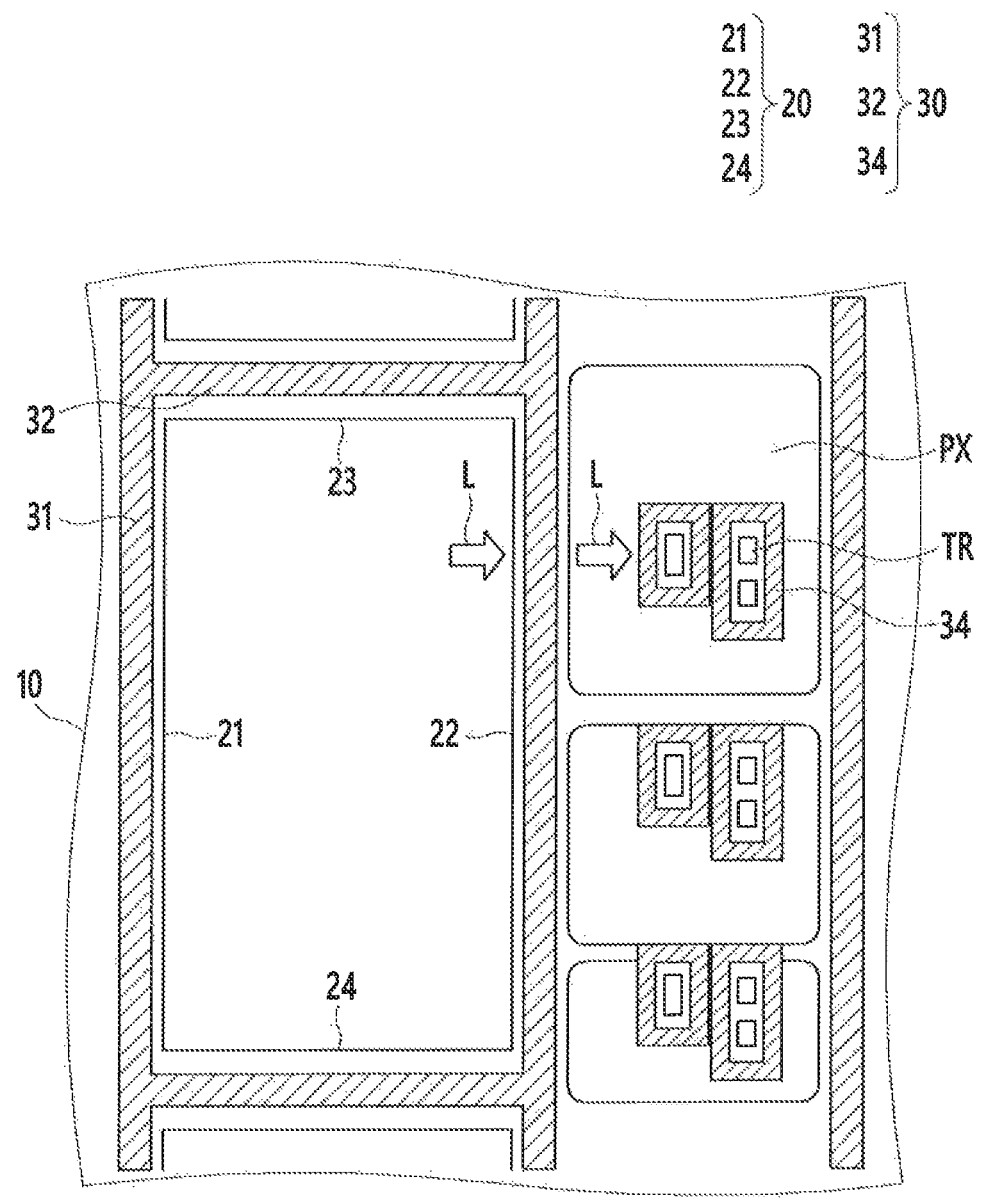
FIG. 16 is a schematic layout view of an organic light emitting diode display according to an exemplary embodiment of the inventive concept.

FIG. 16 is a schematic layout view of an organic light emitting diode display according to an exemplary embodiment of the inventive concept.

The exemplary embodiment shown in FIG. 16 is substantially the same as the exemplary embodiments shown in FIGS. 13 15. For convenience of explanation, a further description of elements previously described may be omitted herein.

As shown in FIG. 16, in an exemplary embodiment, a light blocking member 30 includes a long barrier light blocking member 31, a short barrier light blocking member 32, and a transistor light blocking member 34. The long bather light blocking member 31 is disposed in areas corresponding to long barriers 21 and 22 of a transmissive window 20, and the short barrier light blocking member 32 is disposed in areas corresponding to short barrier 23 and 24 of the transmissive window 20. In addition, the transistor light blocking member 34 surrounds (e.g., entirely surrounds) a transistor TR. The light blocking member 30 may block external light L incident on the transistor TR of the pixel TX through the long barrier light blocking member 31 and the short barrier light blocking member 32, as well as through the transistor light blocking member 34. Thus, a leakage current of the transistors TR due to the external light L may be further reduced.

In the exemplary embodiment shown in FIG. 16, the transistor light blocking member 34, the long barrier light blocking member 31, and the short barrier light blocking member 32 are illustrated. However, the inventive concept is not limited thereto. For example, in exemplary embodiments, a pixel light blocking member may be disposed between neighboring pixels in addition to the transistor light blocking member 34, the long harrier light blocking member 31, and the short barrier light blocking member 32.

Hereinafter, an organic light emitting diode display according to an exemplary embodiment of the present inventive concept will be described with reference to FIG. 17.

Figure 17:
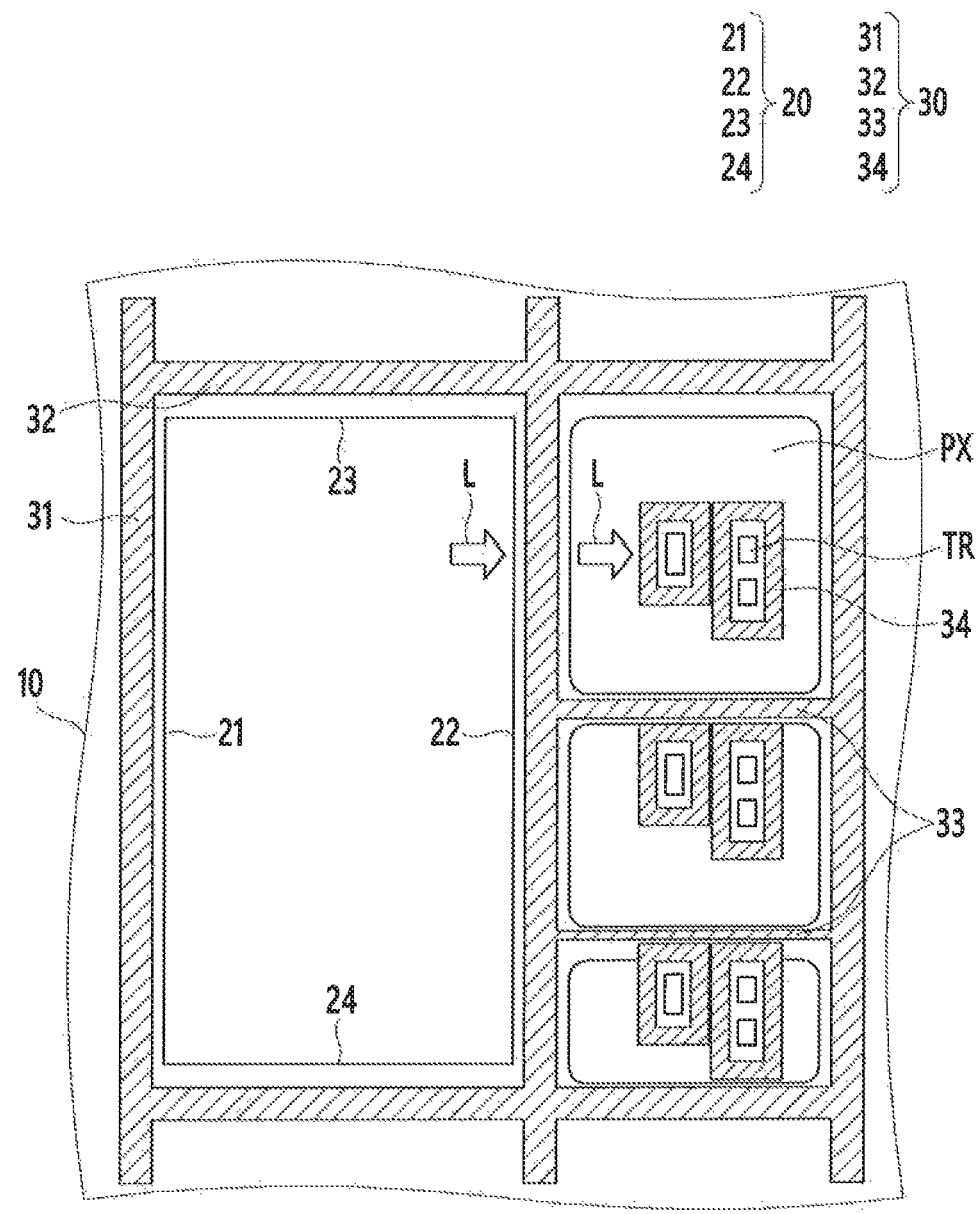
FIG. 17 is a schematic layout view of an organic light emitting diode display according to an exemplary embodiment of the inventive concept.

FIG. 17 is a schematic layout view of an organic light emitting diode display according to an exemplary embodiment of the inventive concept.

The exemplary embodiment shown in FIG. 17 is substantially the same as the exemplary embodiment shown in FIG. 16, except for a structure of a light blocking member. For convenience of explanation, a further description of elements previously described may be omitted herein.

As shown in FIG. 17, in an exemplary embodiment, a light blocking member 30 includes a long barrier light blocking member 31, a short barrier light blocking member 32, a pixel light blocking member 33, and a transistor light blocking member 34. The long barrier light blocking member 31 is disposed in areas corresponding to long barriers 21 and 22 of a transmissive window 20, and the short barrier light blocking member 32 is disposed in areas corresponding to short barriers 23 and 24 of the transmissive window 20. In addition, the pixel light blocking member 33 is disposed between neighboring pixels PX, and the transistor light blocking member 34 surrounds (e.g., entirely surrounds) a transistor TR. The light blocking member 30 may block external light L incident on the transistor TR of the pixel PX through the long barrier light blocking member 31, the short barrier light blocking member 32, and the transistor light blocking member 34, as well as through the pixel light blocking member 33. Accordingly, a leakage current of the transistor TR due to the external light L may be reduced.

In the exemplary embodiments shown in FIGS. 1 to 10, the light blocking members are formed of a plurality of electrode members. However, the present inventive concept is not limited thereto. For example, in exemplary embodiments, the light blocking member may be formed of the same material as the pixel electrode.

Figure 18:
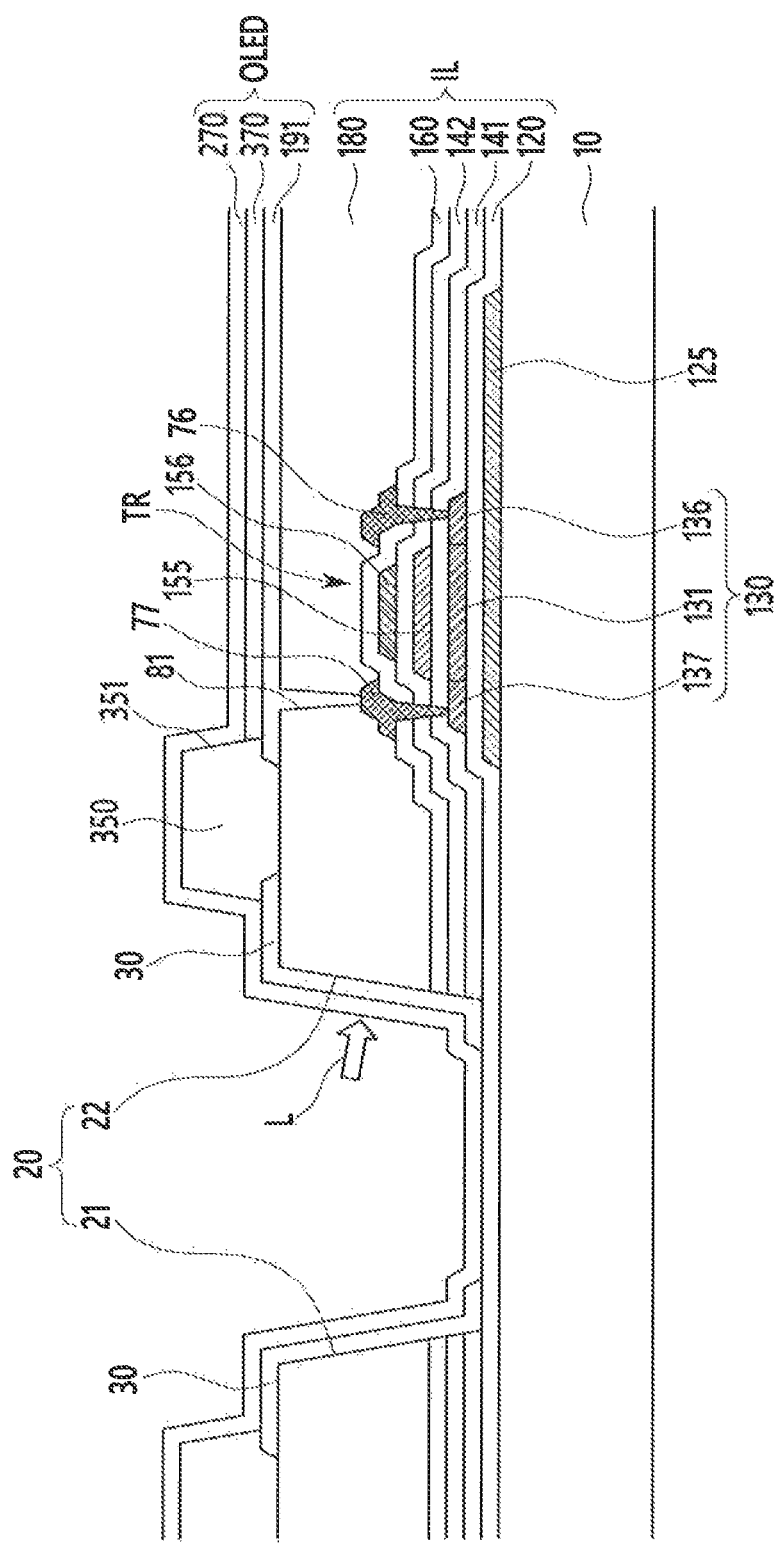
FIG. 18 is a schematic cross-sectional view of an organic light emitting diode display according to an exemplary embodiment of the inventive concept.

Hereinafter, an organic light emitting diode display according to an exemplary embodiment of the present inventive concept will be described with reference to FIG. 18, FIG. 18 is a schematic cross-sectional view of an organic light emitting diode display according to an exemplary embodiment of the inventive concept.

The exemplary embodiment shown in FIG. 18 is substantially the same as the exemplary embodiment shown in FIGS. 1 and 2, except for a structure of a light blocking member. For convenience of explanation, a further description of elements previously described may be omitted herein.

As shown in FIG. 18, in an exemplary embodiment, light blocking members 30 are electrically separated from a plurality of electrode members 125, 130, 155, 156, 76, and 77 in an organic light emitting diode display. A plurality of insulation layers IL have an opening, and the opening forms a transmissive window 20. The transmissive window 20 includes a first long barrier 21 and a second long barrier 22 that face each other. A light blocking member 30 extends to the surfaces of the long barriers 21 and 22 of the transmissive window 20 from the same layer as the pixel electrode 191. For example, the light blocking member 30 extends to the surfaces of the long barriers 21 and 22 of the transmissive window 20 from above the fifth insulation layer 180. The light blocking member 30 may include the same material as the pixel electrode 191.

Thus, the light blocking member 30 may block external light L incident on a transistor TR through the transmissive window 20. Accordingly, a leakage current of the transistor TR due to the external light L may be reduced.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. An organic light emitting diode display, comprising:
   a substrate;
   a plurality of pixels disposed on the substrate, wherein the pixels display an image;
   a plurality of transmissive windows spaced apart from the pixels, wherein light is transmitted through the transmissive windows; and
   a light blocking member disposed between one of the pixels and one of the transmissive windows,
   wherein each pixel comprises:
   a storage capacitor; and
   a transistor comprising a plurality of electrode members disposed in different layers on the substrate,
   wherein the light blocking member comprises a plurality of light blocking sub-members respectively disposed in the same layers as the plurality of electrode members,
   wherein the light blocking member is distinct from the storage capacitor.

2. The organic light emitting diode display of claim 1, wherein the plurality of electrode members comprises:
   a light blocking electrode disposed on the substrate;
   a semiconductor member that overlaps the light blocking electrode;
   a first gate electrode disposed on the semiconductor member;
   a second gate electrode disposed on the first gate electrode;
   a source electrode connected to the semiconductor member; and
   a drain electrode connected to the semiconductor member, wherein the source electrode and the drain electrode are disposed on opposite sides of the first gate electrode.

3. The organic light emitting diode display of claim 2, wherein the plurality of light blocking sub-members comprises at least two of:
   a first light blocking sub-member disposed in the same layer as the light blocking electrode;
   a second light blocking sub-member disposed in the same layer as the first gate electrode;
   a third light blocking sub-member disposed in the same layer as the second gate electrode; and
   a fourth light blocking sub-member disposed in the same layer as the source electrode.

4. The organic light emitting diode display of claim 1, wherein each pixel comprises:
   a plurality of insulation layers respectively disposed in the different layers on the substrate, wherein the insulation layers insulate the electrode members from one another;
   a first electrode connected to the transistor;
   a second electrode disposed on the first electrode; and
   an organic emission layer disposed between the first electrode and the second electrode,
   wherein the transmissive window comprises an opening that penetrates at least one of the plurality of insulation layers, and the transmissive window partially overlaps the second electrode.

5. The organic light emitting diode display of claim 1, wherein the light blocking member is electrically connected to a power line through which power is applied.

6. The organic light emitting diode display of claim 1, wherein the transmissive window comprises a long barrier disposed adjacent to the one of the pixels and a short barrier connected to the long barrier, and
   the light blocking member comprises a long barrier light blocking member disposed adjacent to the long barrier of the transmissive window.

7. The organic light emitting diode display of claim 6, wherein the light blocking member further comprises a short barrier light blocking member disposed adjacent to the short barrier of the transmissive window, and
   the long barrier light blocking member and the short barrier light blocking member surround the transmissive window.

8. The organic light emitting diode of claim 7, wherein the light blocking member further comprises a pixel light blocking member disposed between adjacent pixels.

* * * * *